US012176375B2

(12) United States Patent
Zhan et al.

(10) Patent No.: US 12,176,375 B2
(45) Date of Patent: Dec. 24, 2024

(54) IMAGE SENSOR STRUCTURE INCLUDING NANOWIRE STRUCTURE AND MANUFACTURING METHOD THEREOF

(71) Applicant: United Microelectronics Corp., Hsinchu (TW)

(72) Inventors: Zhaoyao Zhan, Singapore (SG); Jing Feng, Singapore (SG); Qianwei Ding, Singapore (SG); Xiaohong Jiang, Singapore (SG); Ching-Hwa Tey, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 220 days.

(21) Appl. No.: 17/322,599

(22) Filed: May 17, 2021

(65) Prior Publication Data

US 2022/0336519 A1    Oct. 20, 2022

(30) Foreign Application Priority Data

Apr. 16, 2021 (TW) ................. 110113759

(51) Int. Cl.
*H01L 27/146* (2006.01)
(52) U.S. Cl.
CPC .... *H01L 27/14647* (2013.01); *H01L 27/1461* (2013.01); *H01L 27/14636* (2013.01); *H01L 27/14689* (2013.01)
(58) Field of Classification Search
CPC ........... H01L 27/14647; H01L 27/1461; H01L 27/14636; H01L 27/14689
See application file for complete search history.

(56) References Cited

U.S. PATENT DOCUMENTS

| 9,024,295 | B2 | 5/2015 | Wang et al. | |
|---|---|---|---|---|
| 9,263,613 | B2 | 2/2016 | Yu et al. | |
| 9,431,388 | B1* | 8/2016 | Gauthier, Jr. | ..... H01L 29/78618 |
| 2008/0277701 | A1* | 11/2008 | Lee | ................... H01L 27/14689 257/292 |
| 2010/0186809 | A1* | 7/2010 | Samuelson | ..... H01L 31/035281 136/256 |
| 2012/0032148 | A1* | 2/2012 | Olson | ................. H01L 31/0725 977/762 |
| 2020/0235257 | A1* | 7/2020 | Ahn | ....................... H01L 31/103 |

FOREIGN PATENT DOCUMENTS

TW            202017059         5/2020

OTHER PUBLICATIONS

"Office Action of Taiwan Counterpart Application", issued on May 29, 2024, p. 1-p. 11.

* cited by examiner

*Primary Examiner* — Nicholas J Tobergte
*Assistant Examiner* — Adin Hrnjic
(74) *Attorney, Agent, or Firm* — J.C. PATENTS

(57) ABSTRACT

An image sensor structure including a substrate, a nanowire structure, a first conductive line, a second conductive line, and a third conductive line is provided. The nanowire structure includes a first doped layer, a second doped layer, a third doped layer, and a fourth doped layer sequentially stacked on the substrate. The first doped layer and the third doped layer have a first conductive type. The second doped layer and the fourth doped layer have a second conductive type. The first conductive line is connected to a sidewall of the second doped layer. The second conductive line is connected to a sidewall of the third doped layer. The third conductive line is connected to the fourth doped layer.

10 Claims, 38 Drawing Sheets

IMAGE SENSOR STRUCTURE INCLUDING NANOWIRE STRUCTURE AND MANUFACTURING METHOD THEREOF

CROSS-REFERENCE TO RELATED APPLICATION

This application claims the priority benefit of Taiwan application serial no. 110113759, filed on Apr. 16, 2021. The entirety of the above-mentioned patent application is hereby incorporated by reference herein and made a part of this specification.

BACKGROUND OF THE INVENTION

Field of the Invention

The invention relates to a semiconductor structure, and particularly relates to an image sensor structure.

Description of Related Art

A pixel structure of the current image sensor is formed by image sensing devices (for example, one image sensing device for sensing red light, two image sensing devices for sensing green light, and one image sensing device for sensing blue light) arranged horizontally. Therefore, the current image sensor has the problem of a large pixel area and an unbalanced energy proportion of red, green and blue (RGB).

SUMMARY OF THE INVENTION

The invention provides an image sensor structure and a manufacturing method thereof, which can effectively reduce the pixel area and have a balanced energy proportion of RGB.

The invention provides an image sensor structure, which includes a substrate, a nanowire structure, a first conductive line, a second conductive line, and a third conductive line is provided. The nanowire structure includes a first doped layer, a second doped layer, a third doped layer, and a fourth doped layer sequentially stacked on the substrate. The first doped layer and the third doped layer have a first conductive type. The second doped layer and the fourth doped layer have a second conductive type. The first conductive line is connected to the sidewall of the second doped layer. The second conductive line is connected to the sidewall of the third doped layer. The third conductive line is connected to the fourth doped layer.

According to an embodiment of the invention, in the image sensor structure, the first doped layer may be a portion of the substrate. The top surface of the first doped layer may be higher than the top surface of another portion of the substrate.

According to an embodiment of the invention, in the image sensor structure, the first doped layer and the second doped layer may form a first image sensing device. The second doped layer and the third doped layer may form a second image sensing device. The third doped layer and the fourth doped layer form a third image sensing device.

According to an embodiment of the invention, in the image sensor structure, the first image sensing device, the second image sensing device, and the third image sensing device may be photodiodes.

According to an embodiment of the invention, in the image sensor structure, the dopant concentration of the second doped layer may be greater than the dopant concentration of the first doped layer. The dopant concentration of the third doped layer may be greater than the dopant concentration of the second doped layer. The dopant concentration of the fourth doped layer may be greater than the dopant concentration of the third doped layer.

According to an embodiment of the invention, in the image sensor structure, the dopant concentration of the first doped layer may be $1\times10^{15}$ ions/cm$^3$ to $5\times10^{15}$ ions/cm$^3$, the dopant concentration of the second doped layer may be $1\times10^{16}$ ions/cm$^3$ to $5\times10^{16}$ ions/cm$^3$, the dopant concentration of the third doped layer may be $1\times10^{17}$ ions/cm$^3$ to $5\times10^{17}$ ions/cm$^3$, and the dopant concentration of the fourth doped layer may be $1\times10^{18}$ ions/cm$^3$ to $5\times10^{18}$ ions/cm$^3$.

According to an embodiment of the invention, in the image sensor structure, the third conductive line may be connected to the top surface of the fourth doped layer.

According to an embodiment of the invention, the image sensor structure may further include a first dielectric layer, a second dielectric layer, and a third dielectric layer. The first dielectric layer is disposed on the substrate. The first conductive line is disposed on the first dielectric layer. The second dielectric layer is disposed on the first dielectric layer and the first conductive line. The second conductive line is disposed on the second dielectric layer. The third dielectric layer is disposed on the second dielectric layer and the second conductive line.

According to an embodiment of the invention, the image sensor structure may further include a first conductive plug and a second conductive plug. The first conductive plug is connected to the first conductive line. The second conductive plug is connected to the second conductive line.

According to an embodiment of the invention, the image sensor structure may further include a fourth conductive line and a fifth conductive line. The fourth conductive line is connected to the first conductive plug. The fifth conductive line is connected to the second conductive plug.

The invention provides another image sensor structure, which includes a substrate, a nanowire structure, a first conductive line, a second conductive line, and a third conductive line is provided. The nanowire structure includes a first doped layer, a second doped layer, a third doped layer, and a fourth doped layer sequentially stacked on the substrate. The first doped layer and the third doped layer have a first conductive type. The second doped layer and the fourth doped layer have a second conductive type. The first conductive line is connected to the sidewall of the second doped layer. The cross-sectional shape of the first conductive line is L-shaped. The second conductive line is connected to the sidewall of the third doped layer. The cross-sectional shape of the second conductive line is L-shaped. The third conductive line is connected to the fourth doped layer.

The invention provides a manufacturing method of an image sensor structure, which includes the following steps. A substrate is provided. The substrate is a first doped material layer. A second doped material layer, a third doped material layer, and a fourth doped material layer are sequentially formed on the substrate. The substrate and the third doped material layer have a first conductive type. The second doped material layer and the fourth doped material layer have a second conductive type. The substrate, the second doped material layer, the third doped material layer, and the fourth doped material layer are patterned to form a nanowire structure. The nanowire structure includes a first doped layer, a second doped layer, a third doped layer, and a fourth doped layer sequentially stacked on the substrate. The first doped layer and the third doped layer have the first conductive type. The second doped layer and the fourth doped layer have the second conductive type. A first conductive line connected to the sidewall of the second doped layer is formed. A second conductive line connected to the sidewall of the third doped layer is formed. A third conductive line connected to the fourth doped layer is formed.

According to an embodiment of the invention, in the manufacturing method of the image sensor structure, the method of forming the second doped material layer, the third doped material layer, and the fourth doped material layer may include the following steps. A first epitaxial growth process is performed to form the second doped material layer on the substrate. A second epitaxial growth process is performed to form the third doped material layer on the second doped material layer. A third epitaxial growth process is performed to form the fourth doped material layer on the third doped material layer.

According to an embodiment of the invention, in the manufacturing method of the image sensor structure, the method of forming the second doped material layer, the third doped material layer, and the fourth doped material layer may include the following steps. A first ion implantation process is performed on the substrate to form the second doped material layer. After the first ion implantation process is performed, a second ion implantation process is performed on the substrate to form the third doped material layer. After the second ion implantation process is performed, a third ion implantation process is performed on the substrate to form the fourth doped material layer.

According to an embodiment of the invention, the manufacturing method of the image sensor structure may further include the following step. After the third ion implantation process is performed, a thermal process is performed on the substrate.

According to an embodiment of the invention, in the manufacturing method of the image sensor structure, the dopant concentration of the second doped layer may be greater than the dopant concentration of the first doped layer. The dopant concentration of the third doped layer may be greater than the dopant concentration of the second doped layer. The dopant concentration of the fourth doped layer may be greater than the dopant concentration of the third doped layer.

According to an embodiment of the invention, in the manufacturing method of the image sensor structure, the method of forming the first conductive line may include the following steps. A first dielectric layer is formed on the substrate, the first doped layer, and the second doped layer. The first dielectric layer exposes a portion of the sidewall of the second doped layer. A first conductive layer is conformally formed on the first dielectric layer, the second doped layer, the third doped layer, and the fourth doped layer. A first patterned photoresist layer is formed on the first conductive layer, the second doped layer, the third doped layer, and the fourth doped layer. The height of the first patterned photoresist layer is reduced. After the height of the first patterned photoresist layer is reduced, the height of the top surface of the first patterned photoresist layer may be lower than the height of the top surface of the second doped layer, and the first patterned photoresist layer may expose a portion of the first conductive layer. The portion of the first conductive layer exposed by the first patterned photoresist layer is removed to form a first conductive line.

According to an embodiment of the invention, in the manufacturing method of the image sensor structure, the method of forming the second conductive line may include the following steps. A second dielectric layer is formed on the first dielectric layer and the first conductive line. The second dielectric layer exposes a portion of the sidewall of the third doped layer. A second conductive layer is conformally formed on the second dielectric layer, the third doped layer, and the fourth doped layer. A second patterned photoresist layer is formed on the second conductive layer, the third doped layer, and the fourth doped layer. The height of the second patterned photoresist layer is reduced. After the height of the second patterned photoresist layer is reduced, the height of the top surface of the second patterned photoresist layer may be lower than the height of the top surface of the third doped layer, and the second patterned photoresist layer may expose a portion of the second conductive layer. The portion of the second conductive layer exposed by the second patterned photoresist layer is removed to form a second conductive line.

According to an embodiment of the invention, the manufacturing method of the image sensor structure may further include the following steps. A first conductive plug connected to the first conductive line is formed. A second conductive plug connected to the second conductive line is formed.

According to an embodiment of the invention, the manufacturing method of the image sensor structure may further include the following steps. A fourth conductive line connected to the first conductive plug is formed. A fifth conductive line connected to the second conductive plug is formed.

Based on the above description, in the image sensor structure and the manufacturing method according to the invention, the nanowire structure includes the first doped layer, the second doped layer, the third doped layer, and the fourth doped layer sequentially stacked on the substrate. The first doped layer and the third doped layer have the first conductive type, and the second doped layer and the fourth doped layer have the second conductive type. Thereby, the pixel of the image sensor structure can have image sensing devices that are vertically stacked and respectively used to sense red light, green light, and blue light. Therefore, the pixel area can be effectively reduced, and the energy proportion of RGB can be balanced.

In order to make the aforementioned and other objects, features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
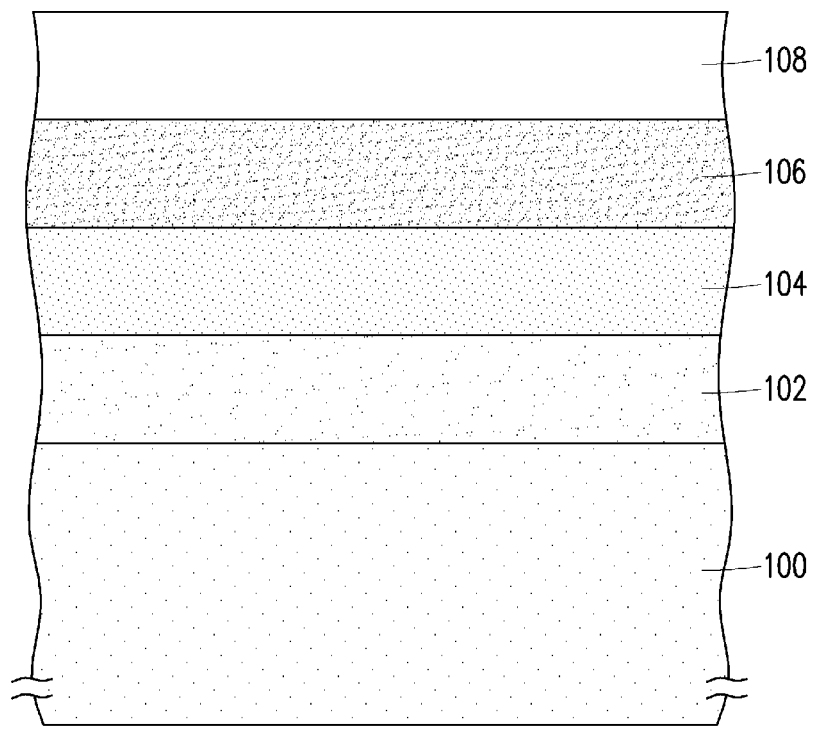
FIG. 1A to FIG. 1R are cross-sectional views illustrating a manufacturing process of an image sensor structure according to an embodiment of the invention.
Figure 1B:
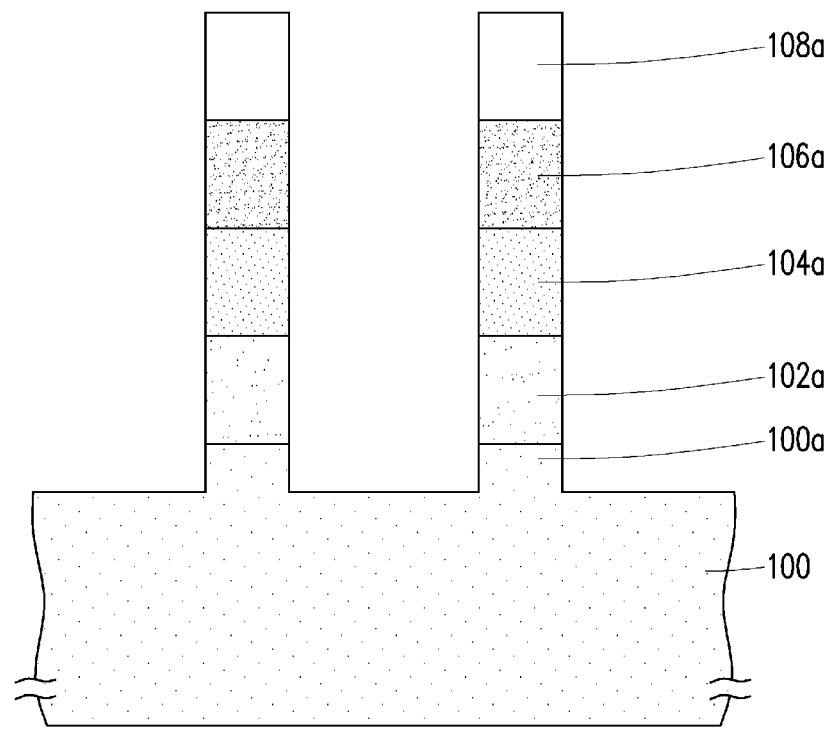
Figure 1C:
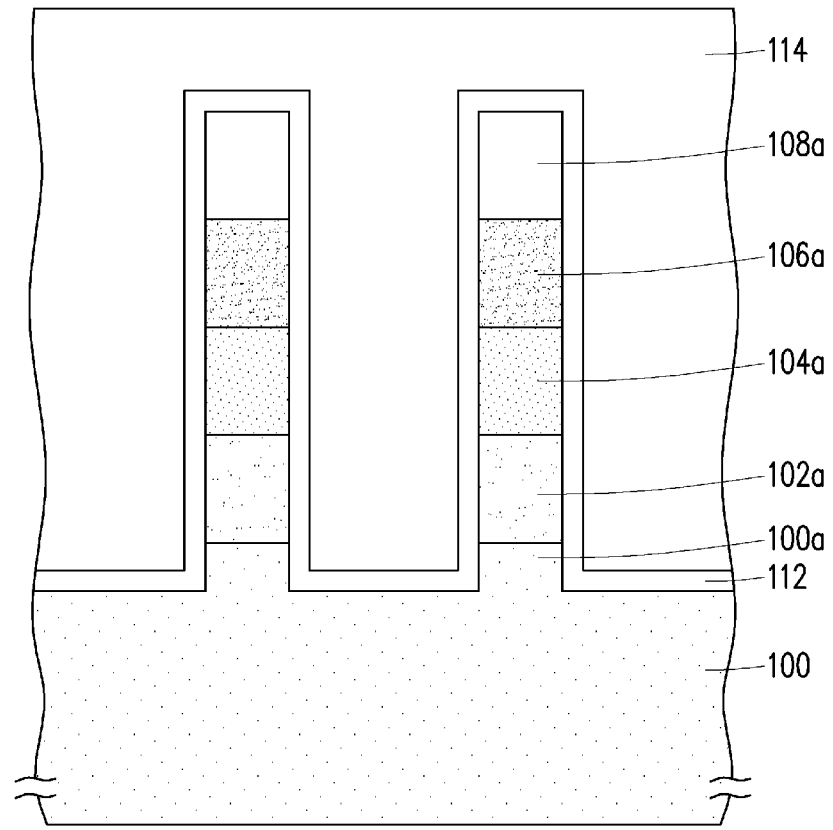
Figure 1D:
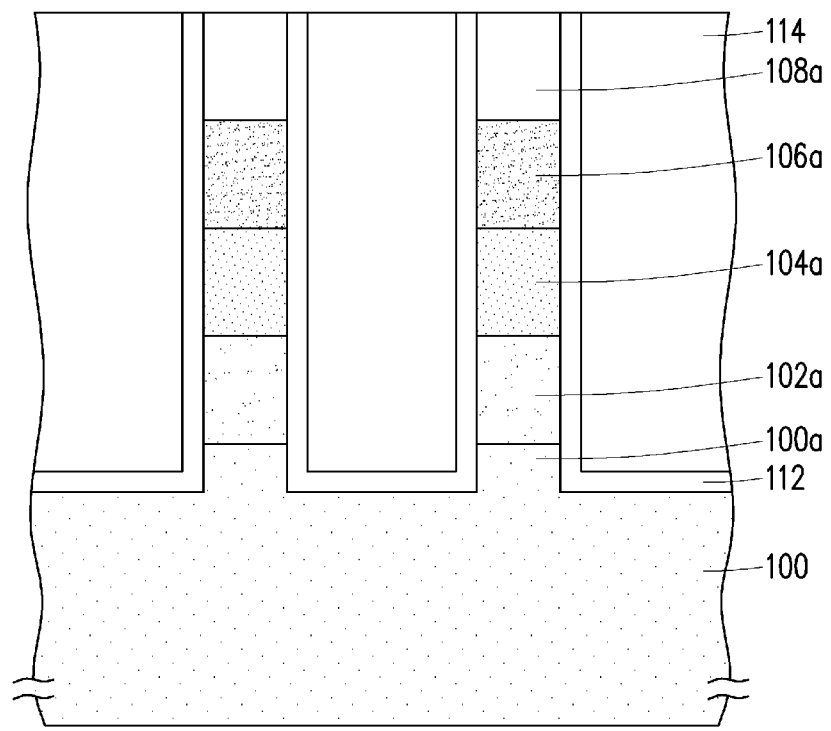
Figure 1E:
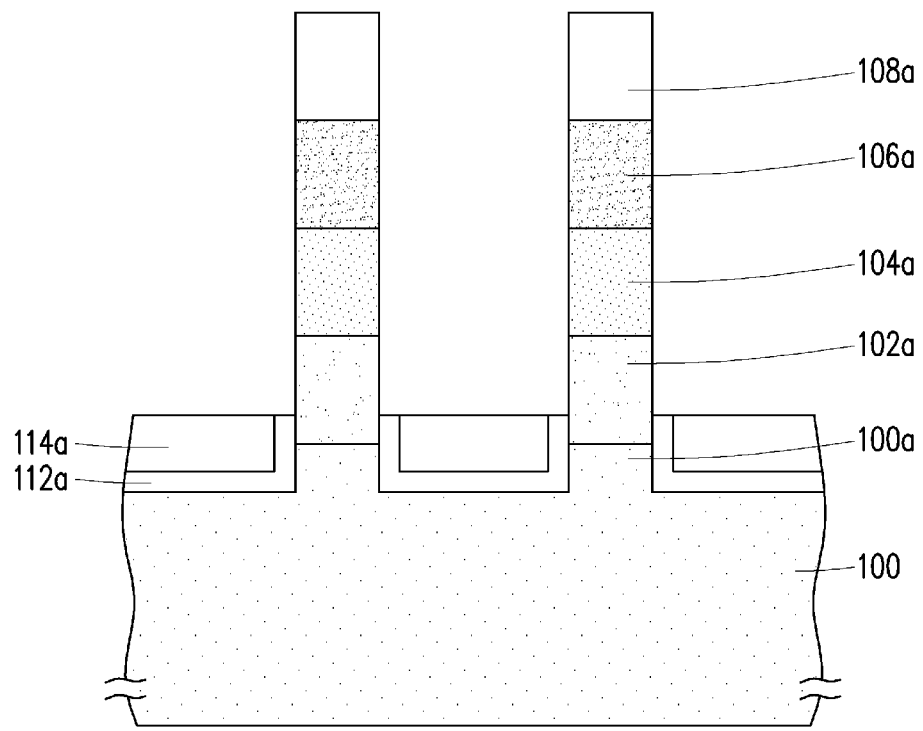
Figure 1F:
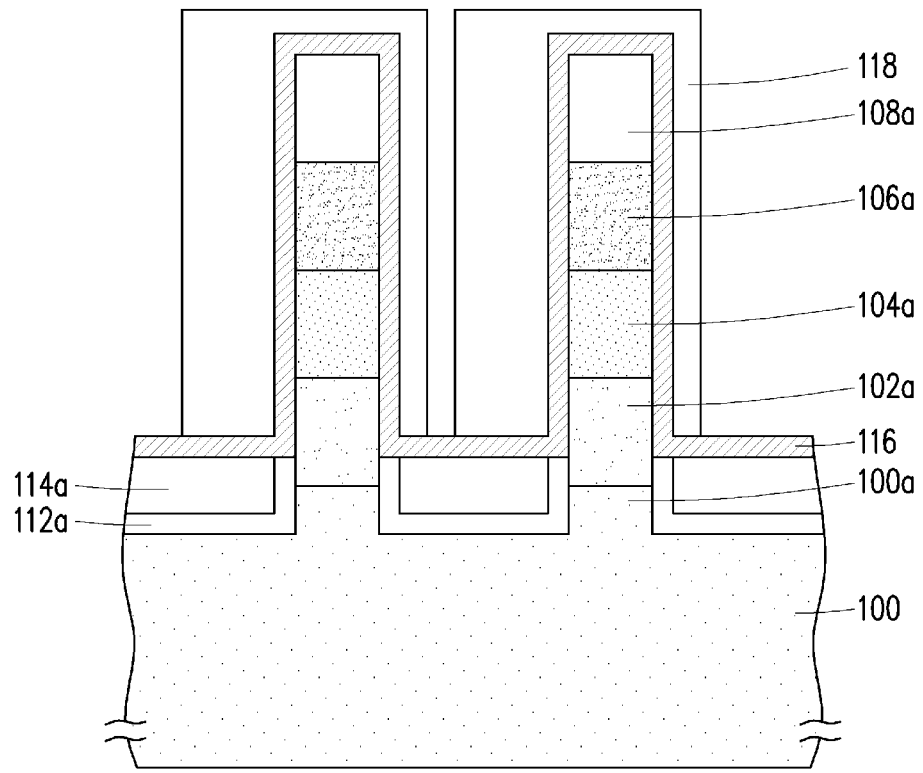
Figure 1G:
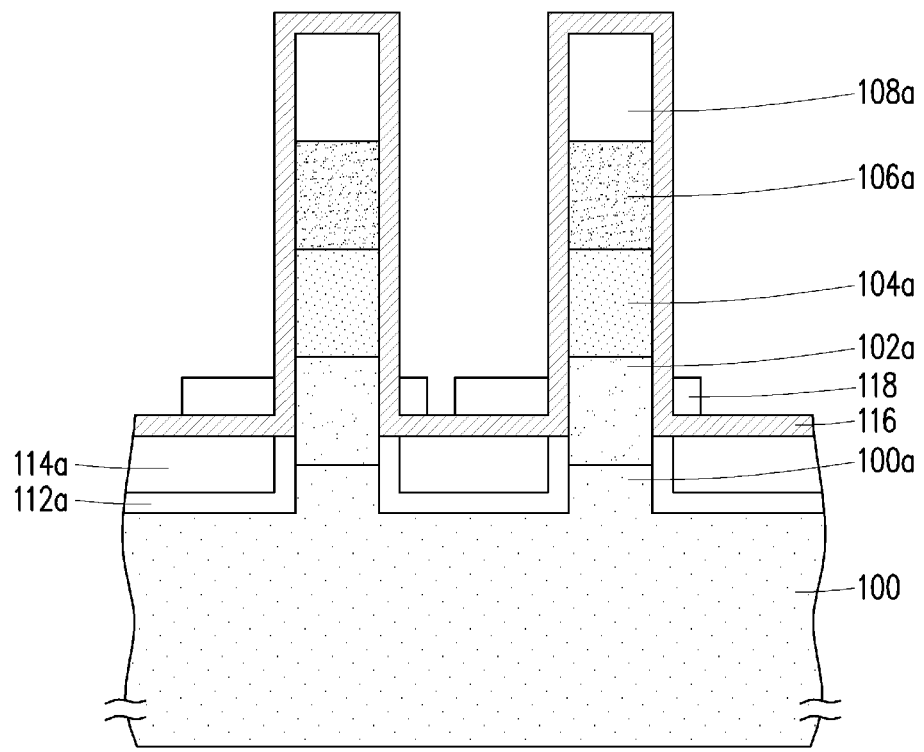
Figure 1H:
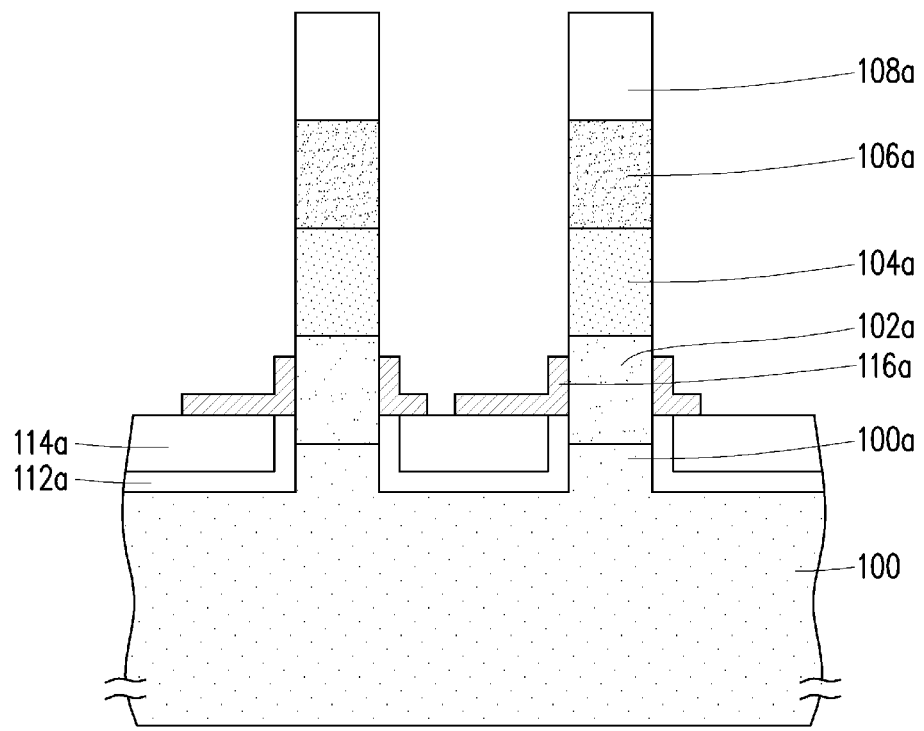
Figure 1I:
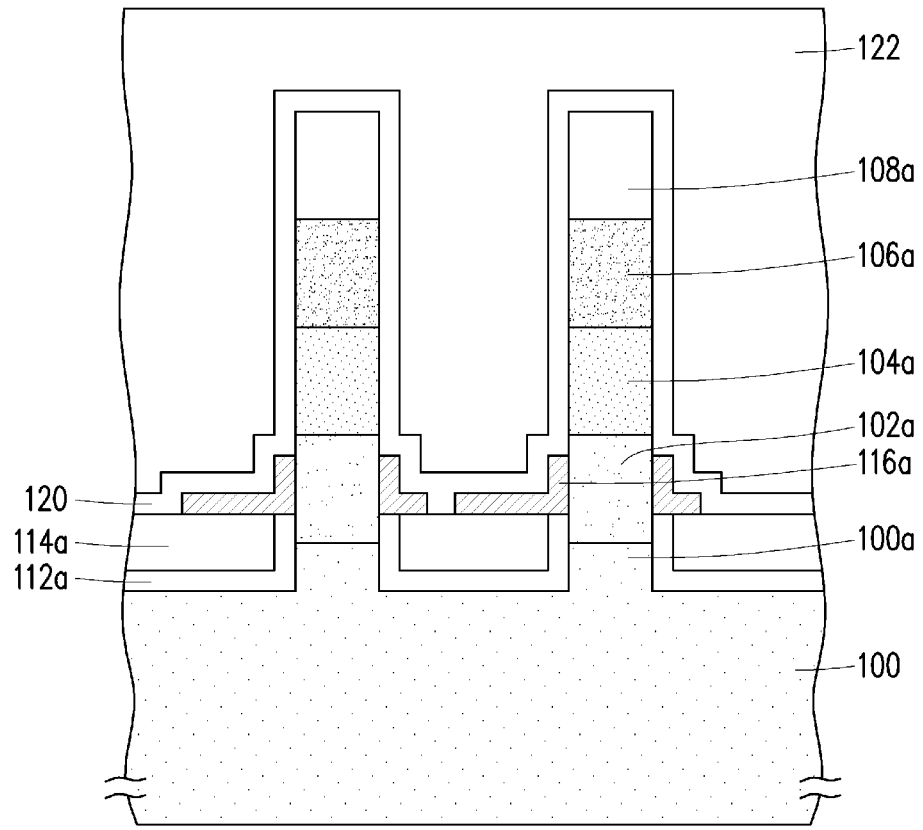
Figure 1J:
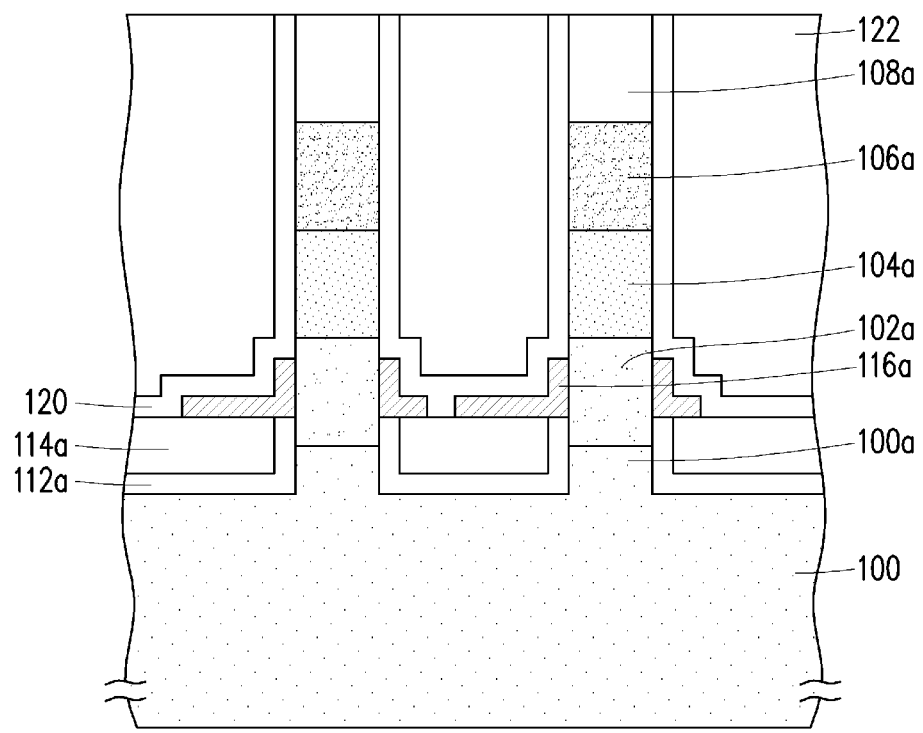
Figure 1K:
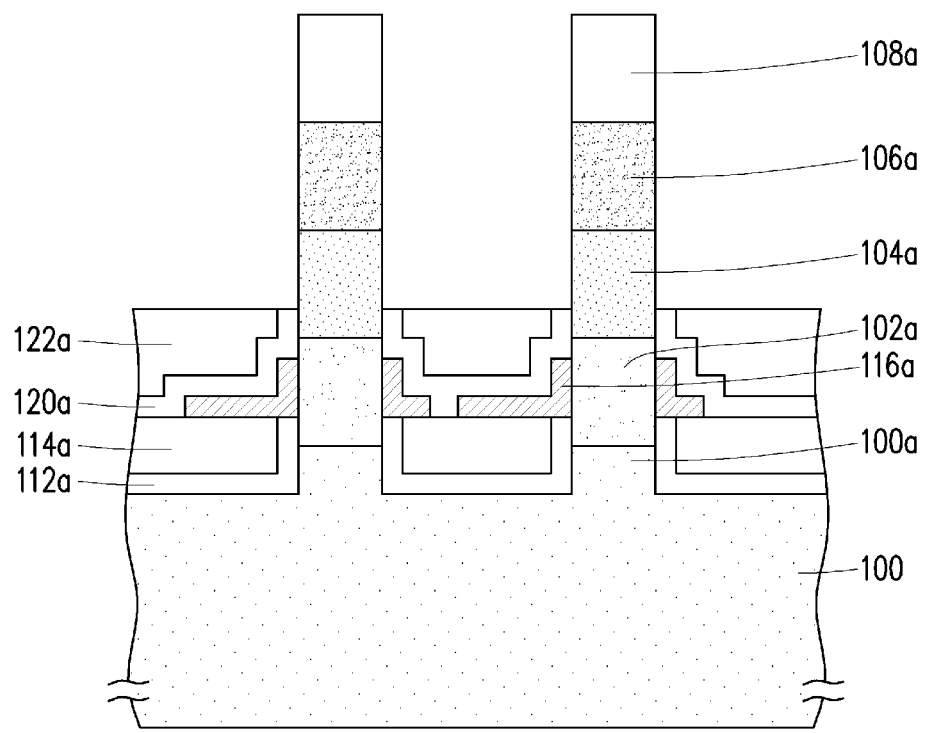
Figure 1L:
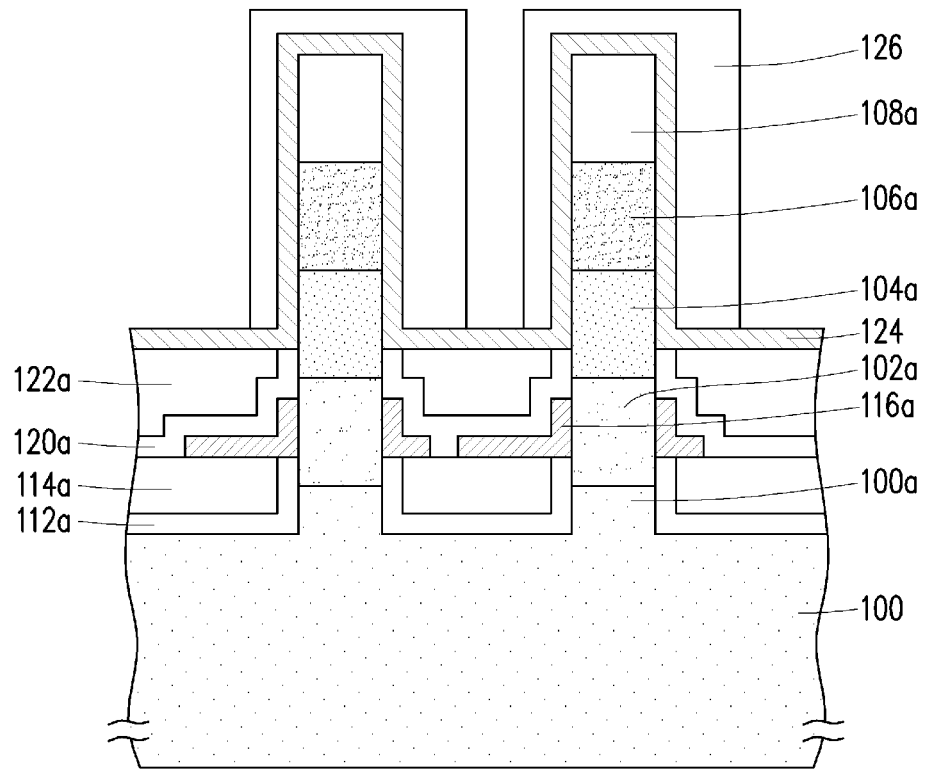
Figure 1M:
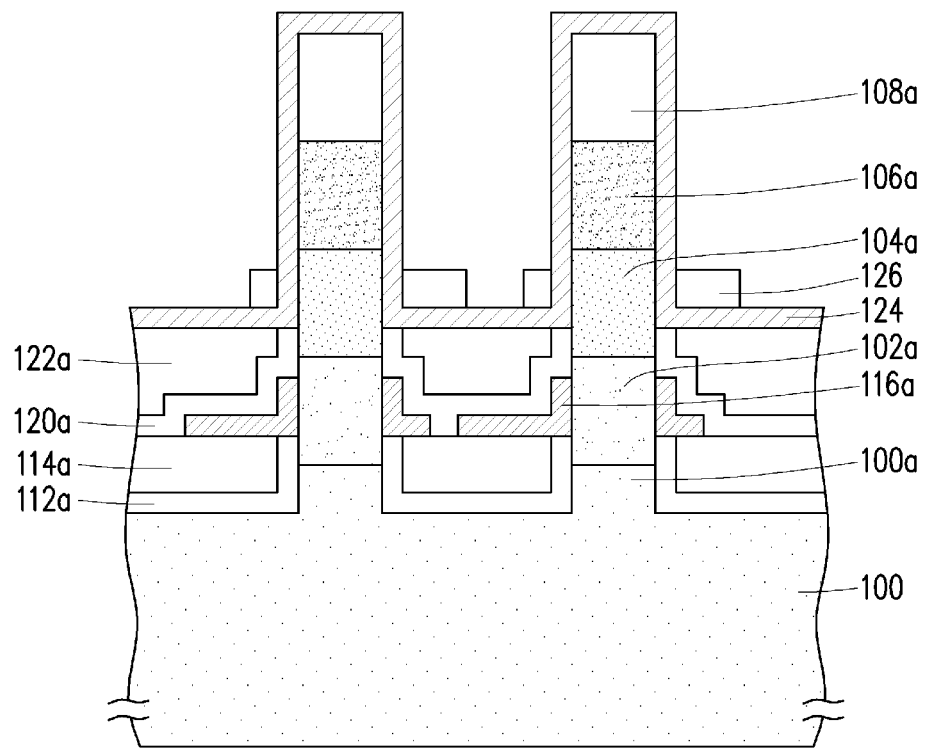
Figure 1N:
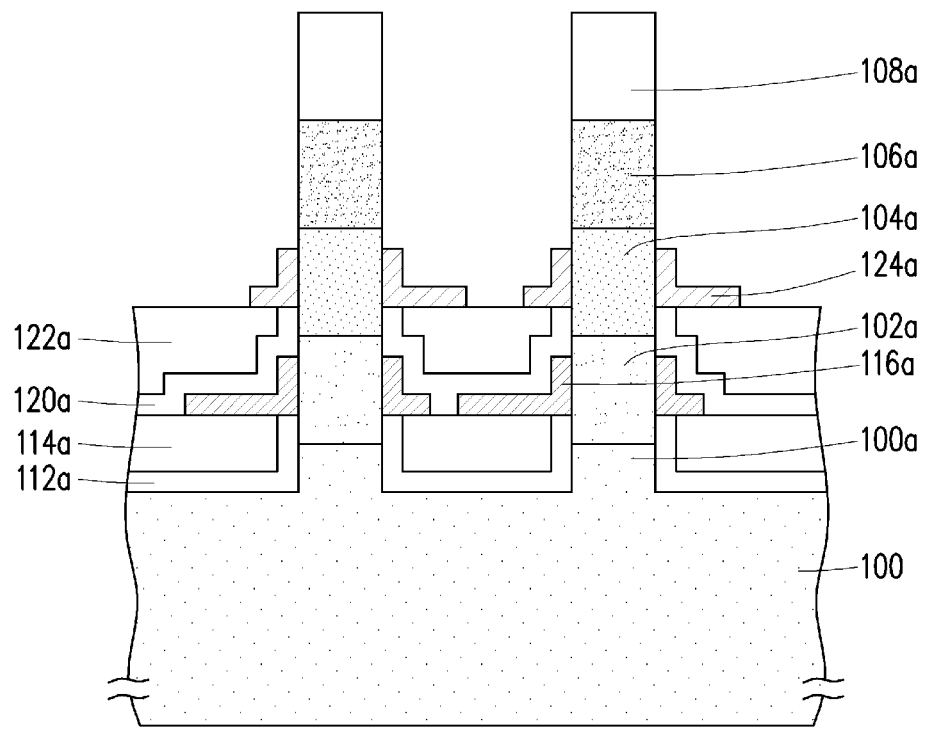
Figure 10:
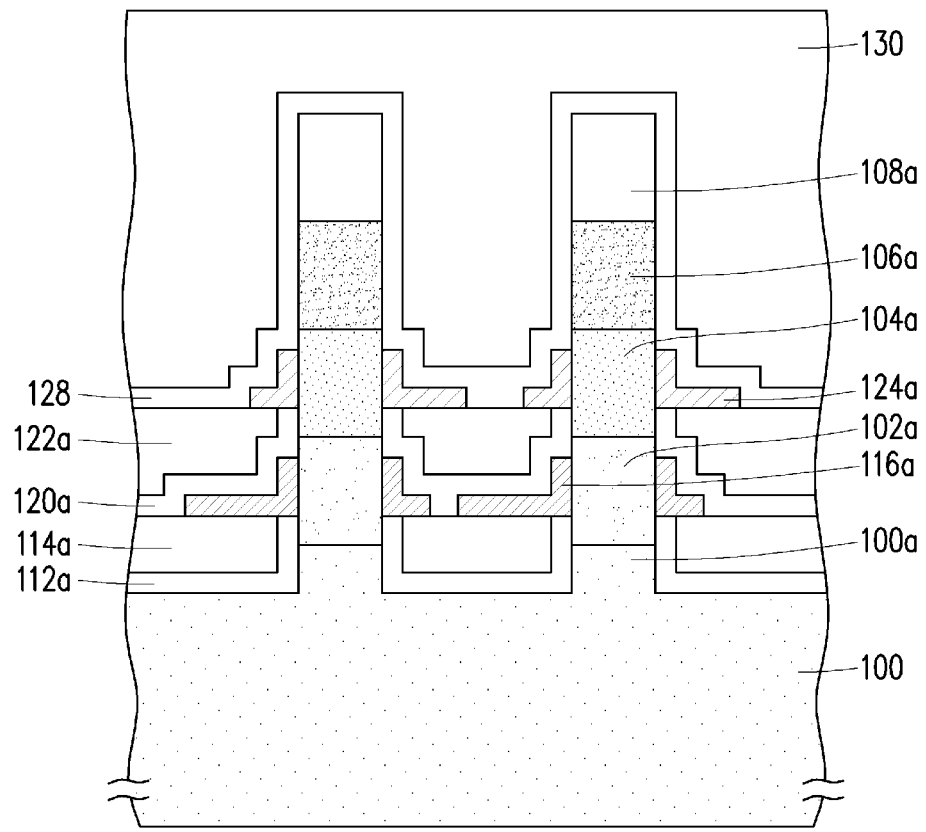
Figure 1P:
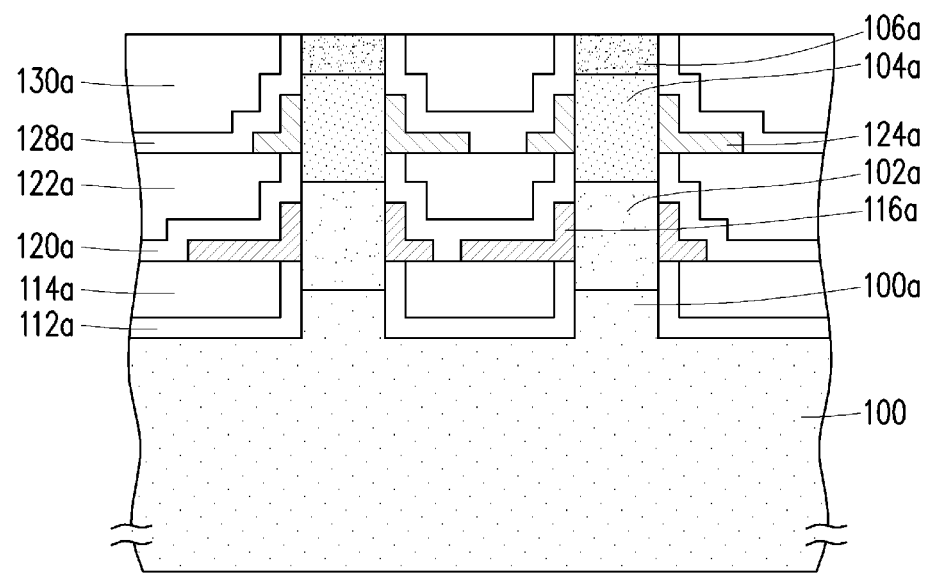
Figure 1Q:
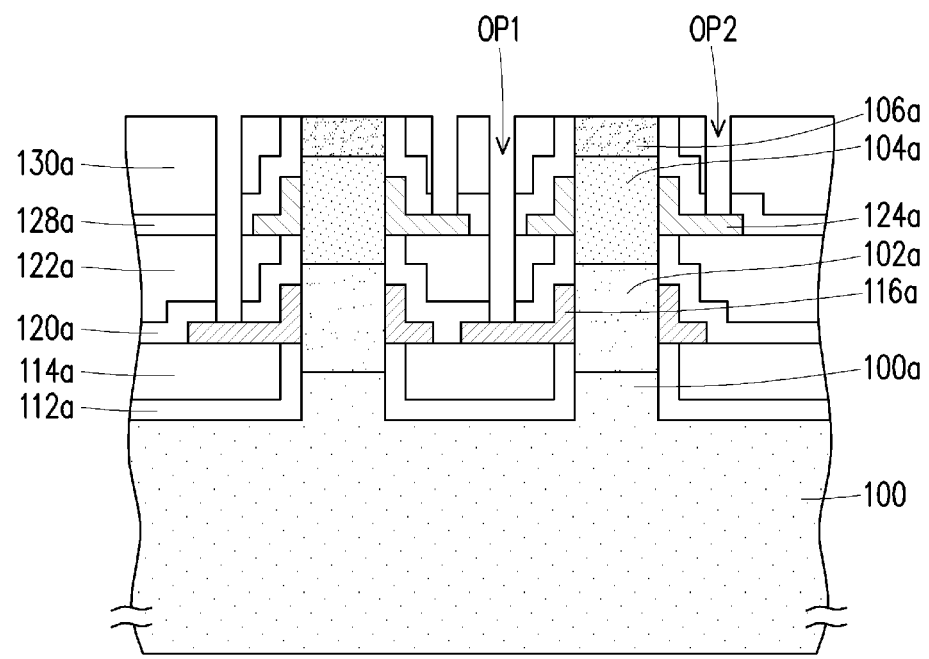
Figure 1R:
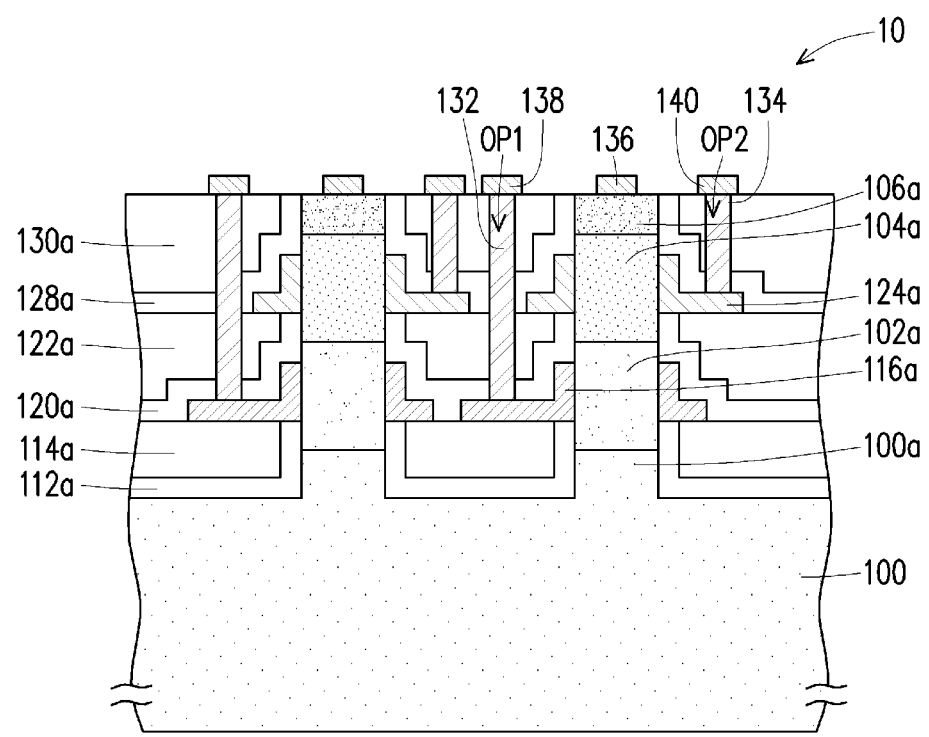

FIG. 1A to FIG. 1R are cross-sectional views illustrating a manufacturing process of an image sensor structure according to an embodiment of the invention.

Referring to FIG. 1A, a substrate 100 is provided. The substrate 100 is a doped material layer. In some embodiments, the substrate 100 may be a doped semiconductor substrate, such as a doped single crystal silicon substrate. The substrate 100 has the first conductive type (e.g., P-type). Hereinafter, the first conductive type and the second conductive type may be different conductive types. The first conductive type and the second conductive type may be one and the other of the P-type and the N-type, respectively. In the present embodiment, the first conductive type is, for example, P-type, and the second conductive type is, for example, N-type, but the invention is not limited thereto. In other embodiments, the first conductive type may be N-type, and the second conductive type may be P-type. In the present embodiment, the conductive type of the substrate 100 is, for example, P-type, and the dopant of the substrate 100 may include boron (B).

A doped material layer 102, a doped material layer 104, and a doped material layer 106 are sequentially formed on the substrate 100. The doped material layer 102 and the doped material layer 106 have the second conductive type (e.g., N-type). The doped material layer 104 has the first conductive type (e.g., P-type). The dopant concentration (e.g., N-type dopant concentration) of the doped material layer 102 may be greater than the dopant concentration (e.g., P-type dopant concentration) of the substrate 100. The dopant concentration (e.g., P-type dopant concentration) of the doped material layer 104 may be greater than the dopant concentration (e.g., N-type dopant concentration) of the doped material layer 102. The dopant concentration (e.g., N-type dopant concentration) of the doped material layer 106 may be greater than the dopant concentration (e.g., P-type dopant concentration) of the doped material layer 104. For example, the dopant concentration of the substrate 100 may be $1 \times 10^{15}$ ions/cm$^3$ to $5 \times 10^{15}$ ions/cm$^3$, the dopant concentration of the doped material layer 102 may be $1 \times 10^{16}$ ions/cm$^3$ to $5 \times 10^{16}$ ions/cm$^3$, the dopant concentration of the doped material layer 104 may be $1 \times 10^{17}$ ions/cm$^3$ to $5 \times 10^{17}$ ions/cm$^3$, and the dopant concentration of the doped material layer 106 may be $1 \times 10^{18}$ ions/cm$^3$ to $5 \times 10^{18}$ ions/cm$^3$.

In some embodiments, the method of forming the doped material layer 102, the doped material layer 104, and the doped material layer 106 may include the following steps. A first epitaxial growth process is performed to form the doped material layer 102 on the substrate 100. A second epitaxial growth process is performed to form the doped material layer 104 on the doped material layer 102. A third epitaxial growth process is performed to form the doped material layer 106 on the doped material layer 104. The first epitaxial growth process, the second epitaxial growth process, and the third epitaxial growth process may be epitaxial growth processes with in-situ doping.

In some embodiments, in the case that the N-type doped material layer 102 is formed by the first epitaxial growth process, the N-type dopant used in the first epitaxial growth process may include arsenic (As), antimony (Sb), bismuth (Bi), or tellurium (Te). The thickness of the doped material layer 102 is, for example, 1 μm to 2 μm. In some embodiments, in the case that the P-type doped material layer 104 is formed by the second epitaxial growth process, the P-type dopant used in the second epitaxial growth process may include boron. In addition, the dopant used in the second epitaxial growth process may further include carbon, thereby effectively inhibiting the boron dopants in the doped material layer 104 from diffusing into the adjacent layers. The concentration of the boron dopant in the doped material layer 104 may be $1 \times 10^{17}$ ions/cm$^3$ to $5 \times 10^{17}$ ions/cm$^3$. The thickness of the doped material layer 104 is, for example, 0.3 μm to 0.6 μm. In some embodiments, in the case that the N-type doped material layer 106 is formed by the third epitaxial growth process, the N-type dopant used in the third epitaxial growth process may include arsenic, antimony, bismuth, or tellurium. The thickness of the doped material layer 106 is, for example, 0.15 μm to 0.35 μm.

In other embodiments, the method of forming the doped material layer 102, the doped material layer 104, and the doped material layer 106 may include the following steps. A first ion implantation process is performed on the substrate 100 to form the doped material layer 102. After the first ion implantation process is performed, a second ion implantation process is performed on the substrate 100 to form the doped material layer 104. After the second ion implantation process is performed, a third ion implantation process is performed on the substrate 100 to form the doped material layer 106.

In some embodiments, in the case that the N-type doped material layer 102 is formed by the first ion implantation process, the N-type dopant used in the first ion implantation process may include phosphorus (P) or arsenic. In some embodiments, in the case that the P-type doped material layer 104 is formed by the second ion implantation process, the P-type dopant used in the second ion implantation process may include boron, boron difluoride (BF$_2$), or indium (In). In addition, in the case that the P-type dopant used in the second ion implantation process is boron or boron difluoride (BF$_2$), the dopant used in the second ion implantation process may further include carbon, thereby effectively inhibiting the boron dopants in the doped material layer 104 from diffusing into the adjacent layers. The concentration of the boron dopant in the doped material layer 104 may be $1 \times 10^{17}$ ions/cm$^3$ to $5 \times 10^{17}$ ions/cm$^3$. In some embodiments, in the case that the N-type doped material layer 106 is formed by the third ion implantation process, the N-type dopant used in the third ion implantation process may include phosphorus, arsenic, antimony, or tellurium. In some embodiments, after the third ion implantation process is performed, a thermal process may be performed to the substrate 100, thereby repairing defects generated by the ion implantation process.

A hard mask material layer 108 may be formed on the doped material layer 106. The material of the hard mask material layer 108 is, for example, silicon oxide, silicon nitride, or a combination thereof. The method of forming the hard mask material layer 108 is, for example, a chemical vapor deposition (CVD) method.

Referring to FIG. 1B, the substrate 100, the doped material layer 102, the doped material layer 104, and the doped material layer 106 are patterned to form a nanowire structure 110. The nanowire structure 110 includes a doped layer 100a, a doped layer 102a, a doped layer 104a, and a doped layer 106a sequentially stacked on the substrate 100. The doped layer 100a and the doped layer 104a have the first conductive type (e.g., P-type). The doped layer 102a and the doped layer 106a have the second conductive type (e.g., N-type). The doped layer 100a, the doped layer 102a, the doped layer 104a, and the doped layer 106a may be nanowires. Furthermore, the hard mask material layer 108 may be patterned to form a hard mask layer 108a on the doped layer 106a. For example, the hard mask material layer 108, the doped material layer 106, the doped material layer 104, the doped material layer 102, and the substrate 100 may be patterned by a lithography process and an etching process to form the doped layer 100a, the doped layer 102a, the doped layer 104a, the doped layer 106a, and the hard mask layer 108a sequentially stacked on the substrate 100.

Referring to FIG. 1C, a liner material layer 112 may be conformally formed on the substrate 100, the nanowire structure 110, and the hard mask layer 108a. The material of the liner material layer 112 is, for example, silicon oxide. The method of forming the liner material layer 112 is, for example, a thermal oxidation method, a CVD method, or an atomic layer deposition (ALD) method.

A dielectric material layer 114 may be formed on the liner material layer 112. The material of the dielectric material layer 114 is, for example, silicon nitride (SiN), silicon carbonitride (SiCN), silicon oxynitride (SiON), or a combination thereof. The method of forming the dielectric material layer 114 is, for example, a CVD method, a physical vapor deposition (PVD) method, or an ALD method.

Referring to FIG. 1D, a portion of the dielectric material layer 114 and a portion of the liner material layer 112 may be removed to expose the top surface of the hard mask layer 108a. The method of removing a portion of the dielectric material layer 114 and a portion of the liner material layer 112 is, for example, a chemical mechanical polishing (CMP) method. Moreover, after a portion of the dielectric material layer 114 and a portion of the liner material layer 112 are removed by the CMP method, the top surface of the dielectric material layer 114, the top surface of the liner material layer 112, and the top surface of the hard mask layer 108a may be flush with each other.

Referring to FIG. 1E, a portion of the dielectric material layer 114 and a portion of the liner material layer 112 may be removed, thereby forming a dielectric layer 114a and a liner layer 112a on the substrate 100, the doped layer 100a, and the doped layer 102a. The dielectric layer 114a may be located on the liner layer 112a. The liner layer 112a may be in direct contact with the substrate 100, the doped layer 100a, and the doped layer 102a. The dielectric layer 114a and the liner layer 112a may expose a portion of the sidewall of the doped layer 102a. In some embodiments, a portion of the dielectric material layer 114 may be removed, and then a portion of the liner material layer 112 may be removed, but the invention is not limited thereto. The method of removing a portion of the dielectric material layer 114 is, for example, an etching method. The method of removing a portion of the liner material layer 112 is, for example, an etching method.

Referring to FIG. 1F, a conductive layer 116 may be conformally formed on the dielectric layer 114a, the doped layer 102a, the doped layer 104a, the doped layer 106a, and the hard mask layer 108a. The material of the conductive layer 116 is, for example, tungsten (W), aluminum (Al), titanium nitride (TiN), tantalum nitride (TaN), titanium carbide (TiC), titanium aluminum (TiAl), titanium aluminum nitride (TiAlN), titanium carbon nitride (TiCN) or doped polysilicon. The method of forming the conductive layer 116 is, for example, a CVD method or an ALD method. In some embodiments, an etch stop layer (not shown) may be conformally formed on the conductive layer 116, and the description thereof is omitted here.

A patterned photoresist layer 118 may be formed on the conductive layer 116, the doped layer 102a, the doped layer 104a, the doped layer 106a, and the hard mask layer 108a. The patterned photoresist layer 118 may be formed by a lithography process.

Referring to FIG. 1G the height of the patterned photoresist layer 118 may be reduced. After the height of the patterned photoresist layer 118 is reduced, the height of the top surface of the patterned photoresist layer 118 may be lower than the height of the top surface of the doped layer 102a, and the patterned photoresist layer 118 may expose a portion of the conductive layer 116. The method of reducing the height of the patterned photoresist layer 118 is, for example, an etching method.

Referring to FIG. 1H, the portion of the conductive layer 116 exposed by the patterned photoresist layer 118 may be removed to form a conductive line 116a. Thereby, a conductive line 116a connected to the sidewall of the doped layer 102a may be formed. The conductive line 116a may be electrically connected to the doped layer 102a. In some embodiments, the conductive line 116a may be in direct contact with the doped layer 102a. The method of removing the portion of the conductive layer 116 is, for example, an etching method.

The patterned photoresist layer 118 may be removed. The method of removing the patterned photoresist layer 118 is, for example, a dry stripping method or a wet stripping method.

Referring to FIG. 1I, a liner material layer 120 may be conformally formed on the dielectric layer 114a, the conductive line 116a, the doped layer 102a, the doped layer 104a, the doped layer 106a, and the hard mask layer 108a. The material of the liner material layer 120 is, for example, silicon oxide. The method of forming the liner material layer 120 is, for example, a CVD method or an ALD method.

A dielectric material layer 122 may be formed on the liner material layer 120. The material of the dielectric material layer 122 is, for example, silicon nitride, silicon carbonitride, silicon oxynitride, or a combination thereof. The method of forming the dielectric material layer 122 is, for example, a CVD method, a PVD method, or an ALD method.

Referring to FIG. 1J, a portion of the dielectric material layer 122 and a portion of the liner material layer 120 may be removed. The method of removing a portion of the dielectric material layer 122 and a portion of the liner material layer 120 is, for example, a CMP method. In addition, after a portion of the dielectric material layer 122 and a portion of the liner material layer 120 are removed by the CMP method, the top surface of the dielectric material layer 122, the top surface of the liner material layer 120, and the top surface of the hard mask layer 108a may be flush with each other.

Referring to FIG. 1K, a portion of the dielectric material layer 122 and a portion of the liner material layer 120 may be removed, thereby forming a dielectric layer 122a and a liner layer 120a on the dielectric layer 114a and the conductive line 116a. The dielectric layer 122a may be located on the liner layer 120a. The liner layer 120a may be in direct contact with the dielectric layer 114a, the conductive line 116a, the doped layer 102a, and the doped layer 104a. The dielectric layer 122a and the liner layer 120a expose a portion of the sidewall of the doped layer 104a. In some embodiments, a portion of the dielectric material layer 122 may be removed, and then a portion of the liner material layer 120 may be removed, but the invention is not limited thereto. The method of removing a portion of the dielectric material layer 122 is, for example, an etching method. The method of removing a portion of the liner material layer 120 is, for example, an etching method.

Referring to FIG. 1L, a conductive layer 124 may be conformally formed on the dielectric layer 122a, the doped layer 104a, the doped layer 106a, and the hard mask layer 108a. The material of the conductive layer 124 is, for example, tungsten, aluminum, titanium nitride, tantalum nitride, titanium carbide, titanium aluminum, titanium aluminum nitride, titanium carbon nitride, or doped polysilicon. The method of forming the conductive layer 124 is, for example, a CVD method or an ALD method. In some embodiments, an etch stop layer (not shown) may be conformally formed on the conductive layer 124, and the description thereof is omitted here.

A patterned photoresist layer 126 may be formed on the conductive layer 124, the doped layer 104a, the doped layer 106a, and the hard mask layer 108a. The patterned photoresist layer 126 may be formed by a lithography process.

Referring to FIG. 1M, the height of the patterned photoresist layer 126 may be reduced. After the height of the patterned photoresist layer 126 is reduced, the height of the top surface of the patterned photoresist layer 126 may be lower than the height of the top surface of the doped layer 104a, and the patterned photoresist layer 126 may expose a portion of the conductive layer 124. The method of reducing the height of the patterned photoresist layer 126 is, for example, an etching method.

Referring to FIG. 1N, the portion of the conductive layer 124 exposed by the patterned photoresist layer 126 may be removed to form a conductive line 124a. Thereby, a conductive line 124a connected to the sidewall of the doped layer 104a may be formed. The conductive line 124a may be electrically connected to the doped layer 104a. In some embodiments, the conductive line 124a may be in direct contact with the doped layer 104a. The method of removing the portion of the conductive layer 124 is, for example, an etching method.

The patterned photoresist layer 126 may be removed. The method of removing the patterned photoresist layer 126 is, for example, a dry stripping method or a wet stripping method.

Referring to FIG. 1O, a liner material layer 128 may be conformally formed on the dielectric layer 122a, the conductive line 124a, the doped layer 104a, the doped layer 106a, and the hard mask layer 108a. The material of the liner material layer 128 is, for example, silicon oxide. The method of forming the liner material layer 128 is, for example, a CVD method or an ALD method.

A dielectric material layer 130 may be formed on the liner material layer 128. The material of the dielectric material layer 130 is, for example, silicon nitride, silicon carbonitride, silicon oxynitride, or a combination thereof. The method of forming the dielectric material layer 130 is, for example, a CVD method, a PVD method, or an ALD method.

Referring to FIG. 1P, a portion of the dielectric material layer 130, a portion of the liner material layer 128, and the hard mask layer 108a may be removed, thereby exposing the top surface of the doped layer 106a and forming a dielectric layer 130a and a liner layer 128a on the dielectric layer 122a and the conductive line 124a. The dielectric layer 130a may be located on the liner layer 128a. The liner layer 128a may be in direct contact with the dielectric layer 122a, the conductive line 124a, the doped layer 104a, and the doped layer 106a. In some embodiments, a portion of the doped layer 106a may be removed. The method of removing a portion of the dielectric material layer 130, a portion of the liner material layer 128, the hard mask layer 108a, and a portion of the doped layer 106a is, for example, a CMP method.

Referring to FIG. 1Q, an opening OP1 exposing the conductive line 116a may be formed in the dielectric layer 130a, the liner layer 128a, the dielectric layer 122a, and the liner layer 120a, and an opening OP2 exposing the conductive line 124a may be formed in the dielectric layer 130a and the liner layer 128a. The method of forming the opening OP1 is, for example, removing a portion of the dielectric layer 130a, a portion of the liner layer 128a, a portion of the dielectric layer 122a, and a portion of the liner layer 120a by a lithography process and an etching process. In addition, the method of forming the opening OP2 is, for example, removing a portion of the dielectric layer 130a and a portion of the liner layer 128a by a lithography process and an etching process.

Referring to FIG. 1R, a conductive plug 132 and a conductive plug 134 may be respectively formed in the opening OP1 and the opening OP2. Thereby, the conductive plug 132 connected to the conductive line 116a may be formed, and the conductive plug 134 connected to the conductive line 124a may be formed. The material of the conductive plug 132 and the conductive plug 134 is, for example, tungsten. The conductive plug 132 and the conductive plug 134 may be electrically connected to the conductive line 116a and the conductive line 124a, respectively. In some embodiments, the conductive plug 132 may be in direct contact with the conductive line 116a, and the conductive plug 134 may be in direct contact with the conductive line 124a. The method of forming the conductive plug 132 and the conductive plug 134 is, for example, forming a conductive layer (not shown) filling the opening OP1 and the opening OP2, and then removing the conductive layer located outside the opening OP1 and the opening OP2 by a CMP method.

A conductive line 136 connected to the doped layer 106a is formed. In addition, a conductive line 138 connected to the conductive plug 132 may be formed. Furthermore, a conductive line 140 connected to the conductive plug 134 may be formed. The conductive line 136, the conductive line 138, and the conductive line 140 may be located on the same plane, thereby facilitating the integration with the back end of line (BEOL) process. The conductive line 136, the conductive line 138, and the conductive line 140 may be electrically connected to the doped layer 106a, the conductive plug 132, and the conductive plug 134, respectively. In some embodiments, the conductive line 136 may be in direct contact with the doped layer 106a, the conductive line 138 may be in direct contact with the conductive plug 132, and the conductive line 140 may be in direct contact with the conductive plug 134. The material of the conductive line 136, the conductive line 138, and the conductive line 140 is, for example, aluminum, tungsten, or titanium. The method of forming the conductive line 136, the conductive line 138, and the conductive line 140 is, for example, forming a conductive layer (not shown) by a deposition process, and then patterning the conductive layer by a lithography process and an etching process.

Hereinafter, the image sensor structure 10 of the above embodiment will be described with reference to FIG. 1R. In addition, although the method for forming the image sensor structure 10 is described by taking the above method as an example, the invention is not limited thereto.

Referring to FIG. 1R, the image sensor structure 10 includes a substrate 100, a nanowire structure 110, a conductive line 116a, a conductive line 124a, and a conductive line 136. The nanowire structure 110 includes a doped layer 100a, a doped layer 102a, a doped layer 104a, and a doped layer 106a sequentially stacked on the substrate 100. The doped layer 100a and the doped layer 104a have the first conductive type (e.g., P-type). The doped layer 102a and the doped layer 106a have the second conductive type (e.g., N-type). The doped layer 100a and the doped layer 102a may form an image sensing device 142. The doped layer 102a and the doped layer 104a may form an image sensing device 144. The doped layer 104a and the doped layer 106a may form an image sensing device 146. For example, the image sensing device 142 may be an image sensing device for sensing red light, the image sensing device 144 may be an image sensing device for sensing green light, and the image sensing device 146 may be an image sensing device for sensing blue light. The image sensing device 142, the image sensing device 144, and the image sensing device 146 may be photodiodes. The doped layer 100a may be a portion of the substrate 100. The top surface of the doped layer 100a may be higher than the top surface of another portion of the substrate 100.

The dopant concentration (e.g., N-type dopant concentration) of the doped layer 102a may be greater than the dopant concentration (e.g., P-type dopant concentration) of the doped layer 100a. The dopant concentration (e.g., P-type dopant concentration) of the doped layer 104a may be greater than the dopant concentration (e.g., N-type dopant concentration) of the doped layer 102a. The dopant concentration (e.g., N-type dopant concentration) of the doped layer 106a may be greater than the dopant concentration (e.g., P-type dopant concentration) of the doped layer 104a. For example, the dopant concentration of the doped layer 100a may be $1 \times 10^{15}$ ions/cm$^3$ to $5 \times 10^{15}$ ions/cm$^3$, the dopant concentration of the doped layer 102a may be $1 \times 10^{16}$ ions/cm$^3$ to $5 \times 10^{16}$ ions/cm$^3$, the dopant concentration of the doped layer 104a may be $1 \times 10^{17}$ ions/cm$^3$ to $5 \times 10^{17}$ ions/cm$^3$, and the dopant concentration of the doped layer 106a may be $1 \times 10^{18}$ ions/cm$^3$ to $5 \times 10^{18}$ ions/cm$^3$.

The conductive line 116a is connected to the sidewall of the doped layer 102a. In some embodiments, the cross-sectional shape of the conductive line 116a may be L-shaped. The conductive line 124a is connected to the sidewall of the doped layer 104a. In some embodiments, the cross-sectional shape of the conductive line 124a may be L-shaped. The conductive line 136 is connected to the doped layer 106a. The conductive line 136 may be connected to the top surface of the doped layer 106a.

The image sensor structure 10 may further include at least one of a dielectric layer 114a, a dielectric layer 122a, a dielectric layer 130a, a liner layer 112a, a liner layer 120a, and a liner layer 128a. The dielectric layer 114a is disposed on the substrate 100. The conductive line 116a is disposed on the dielectric layer 114a. The liner layer 112a is disposed between the dielectric layer 114a and the substrate 100. The dielectric layer 122a is disposed on the dielectric layer 114a and the conductive line 116a. The conductive line 124a is disposed on the dielectric layer 122a. The liner layer 120a is disposed between the dielectric layer 122a and the dielectric layer 114a. The dielectric layer 130a is disposed on the dielectric layer 122a and the conductive line 124a. The liner layer 128a is disposed between the dielectric layer 130a and the dielectric layer 122a.

The image sensor structure 10 may further include at least one of a conductive plug 132, a conductive plug 134, a conductive line 138, and a conductive line 140. The conductive plug 132 is connected to the conductive line 116a. The conductive plug 134 is connected to the conductive line 124a. The conductive line 138 is connected to the conductive plug 132. The conductive line 140 is connected to the conductive plug 134.

In addition, the material, the arrangement, the forming method, and the effect of each component in the image sensor structure 10 have been described in detail in the above embodiments and are not repeated herein.

Based on the above embodiment, in the image sensor structure 10 and the manufacturing method thereof, the nanowire structure 110 includes the doped layer 100a, the doped layer 102a, the doped layer 104a, and the doped layer 106a sequentially stacked on the substrate 100. The doped layer 100a and the doped layer 104a have the first conductive type, and the doped layer 102a and the doped layer 106a have the second conductive type. In this way, the pixel of the image sensor structure 10 can have the image sensing device 142, the image sensing device 144, and the image sensing device 146 that are vertically stacked and respectively used to sense red light, green light, and blue light, thereby effectively reducing the pixel area. In addition, since the image sensing device 142, the image sensing device 144, and the image sensing device 146 may have approximately the same top view area, the image sensor structure 10 can have a balanced energy proportion of RGB. Furthermore, the manufacturing process of the image sensor structure 10 can be integrated with the manufacturing process of the complementary metal oxide semiconductor (CMOS). Moreover, two adjacent pixels in the image sensor structure 10 can be well isolated. On the other hand, the image sensor structure 10 does not need color filters, thereby reducing the manufacturing cost and the process complexity.

Figure 2A:
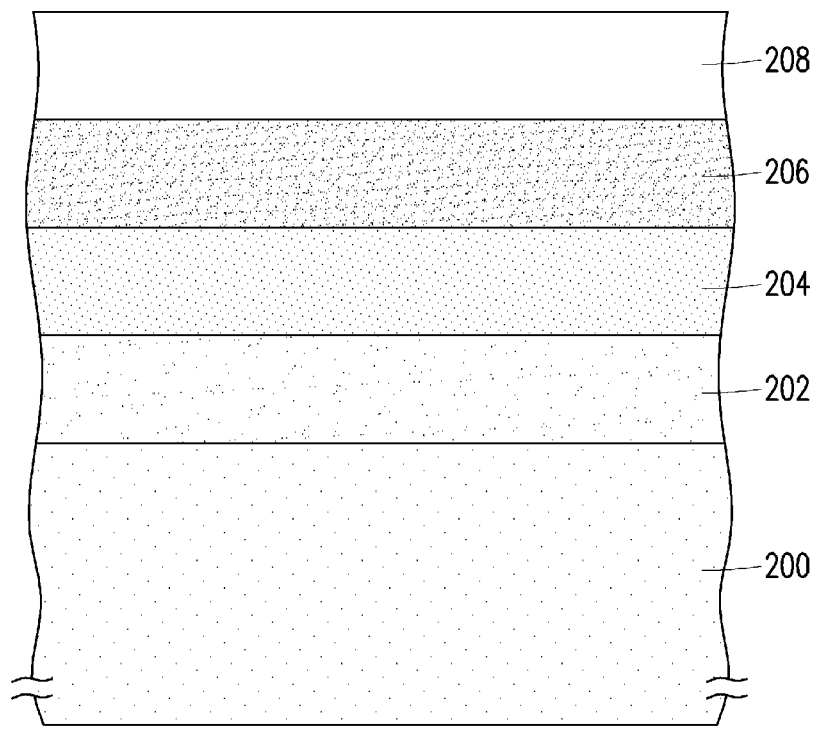
FIG. 2A to FIG. 2T are cross-sectional views illustrating a manufacturing process of an image sensor structure according to another embodiment of the invention.
Figure 2B:
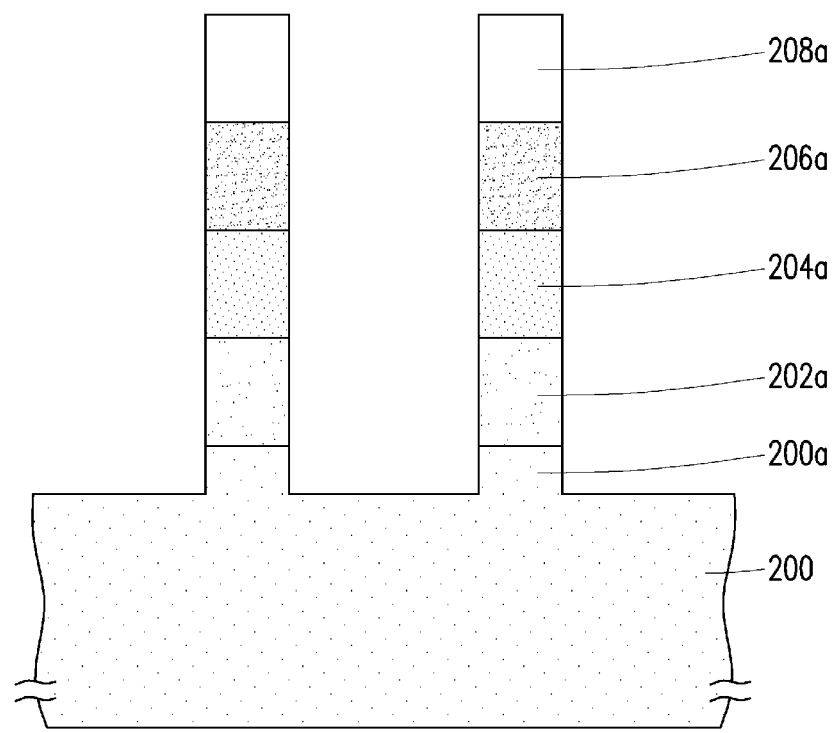
Figure 2C:
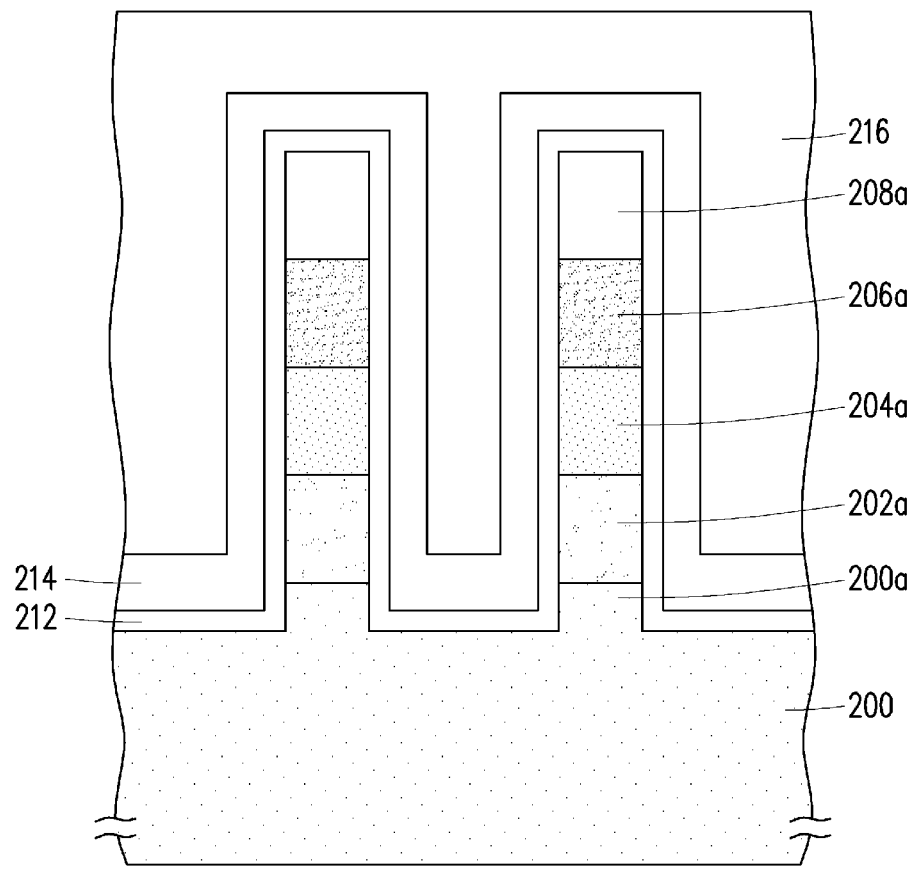
Figure 2D:
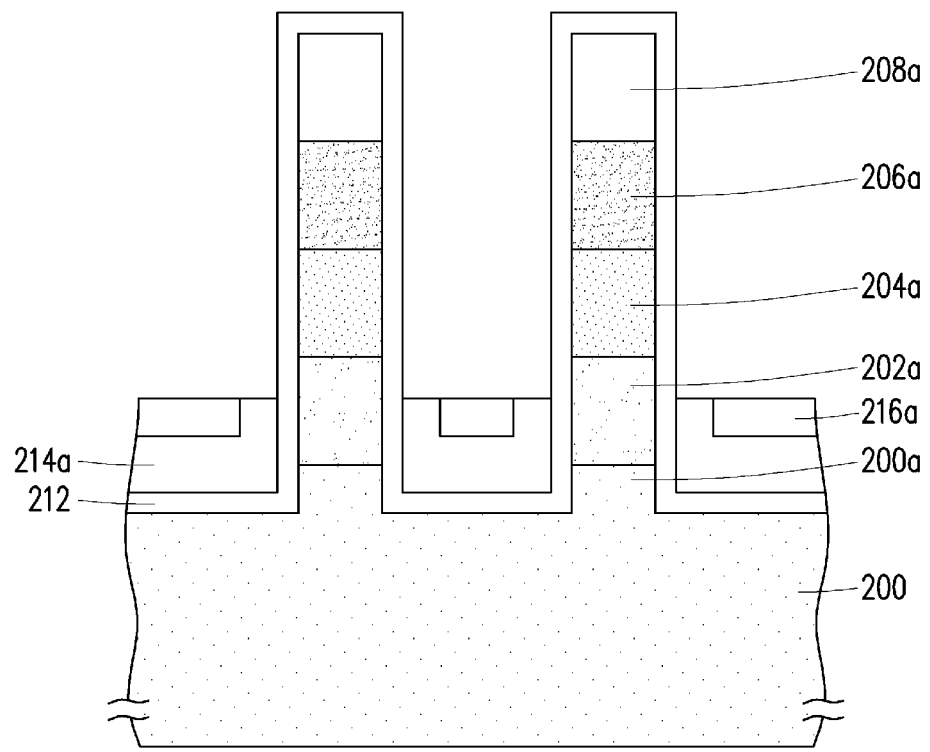
Figure 2E:
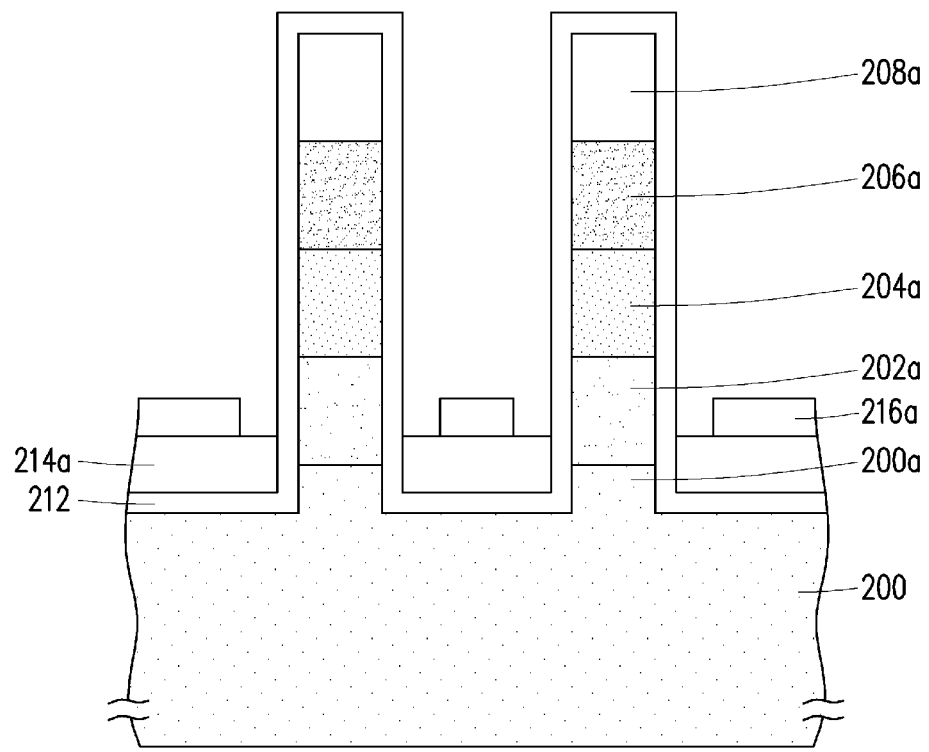
Figure 2F:
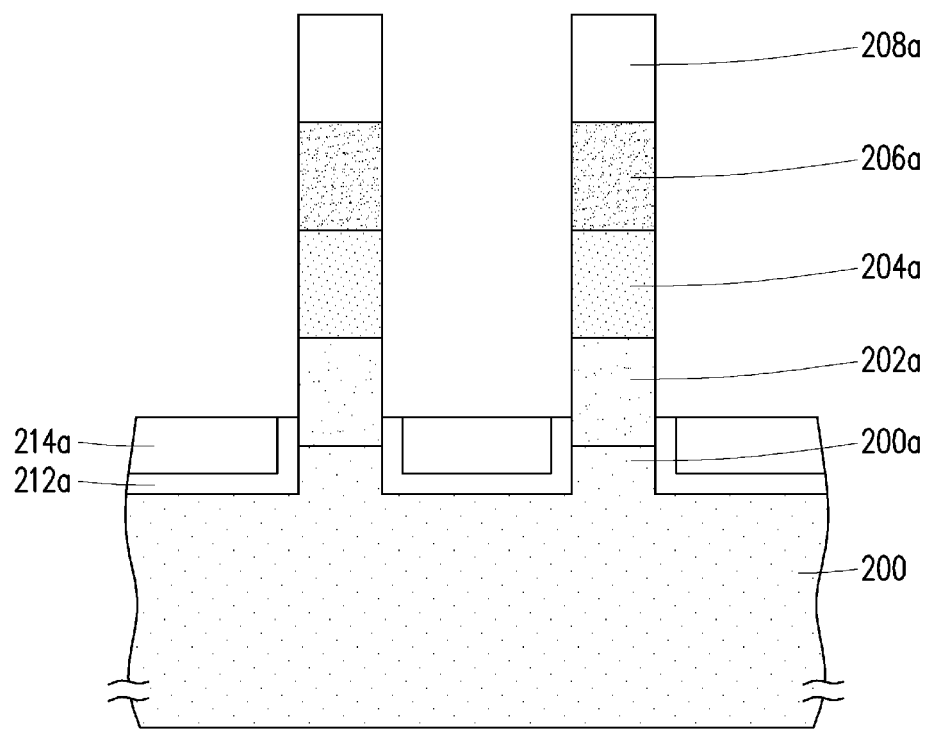
Figure 2G:
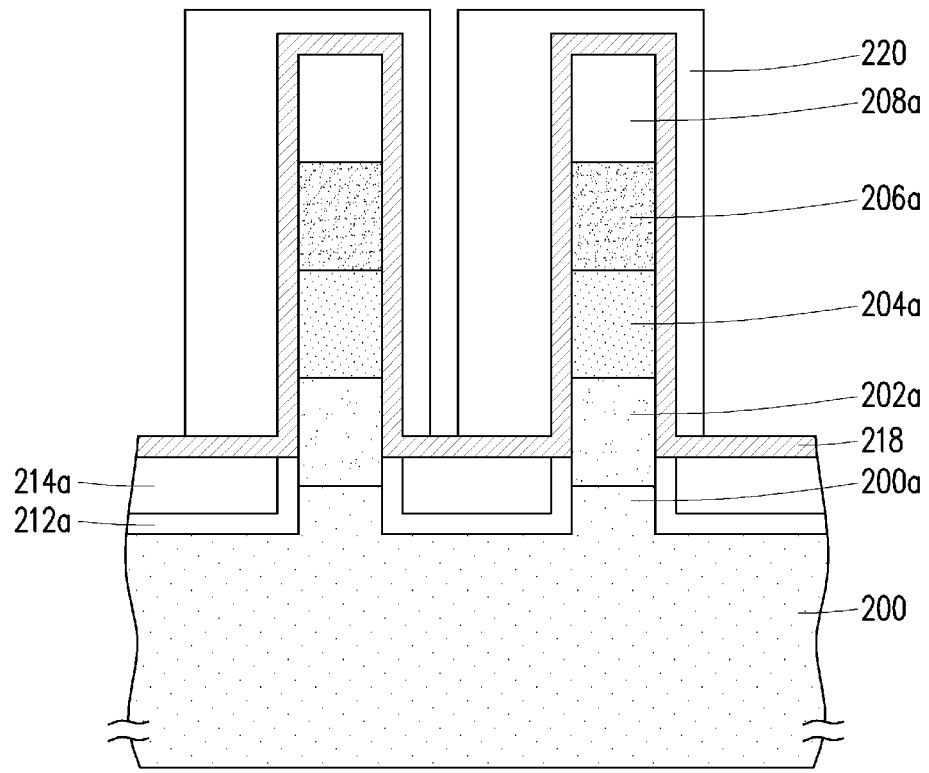
Figure 2H:
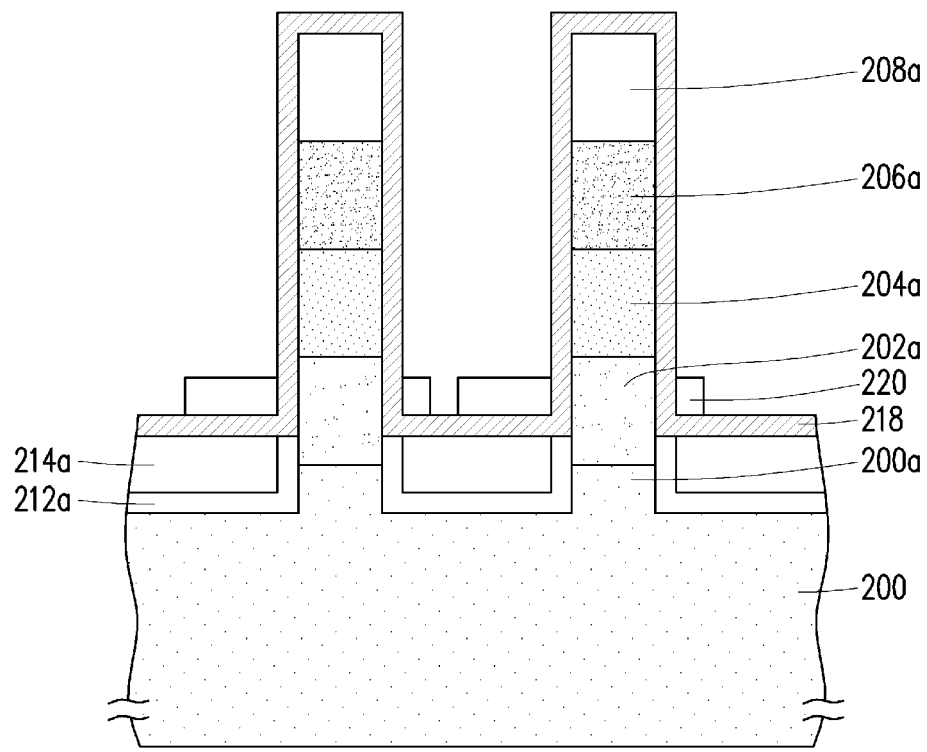
Figure 2I:
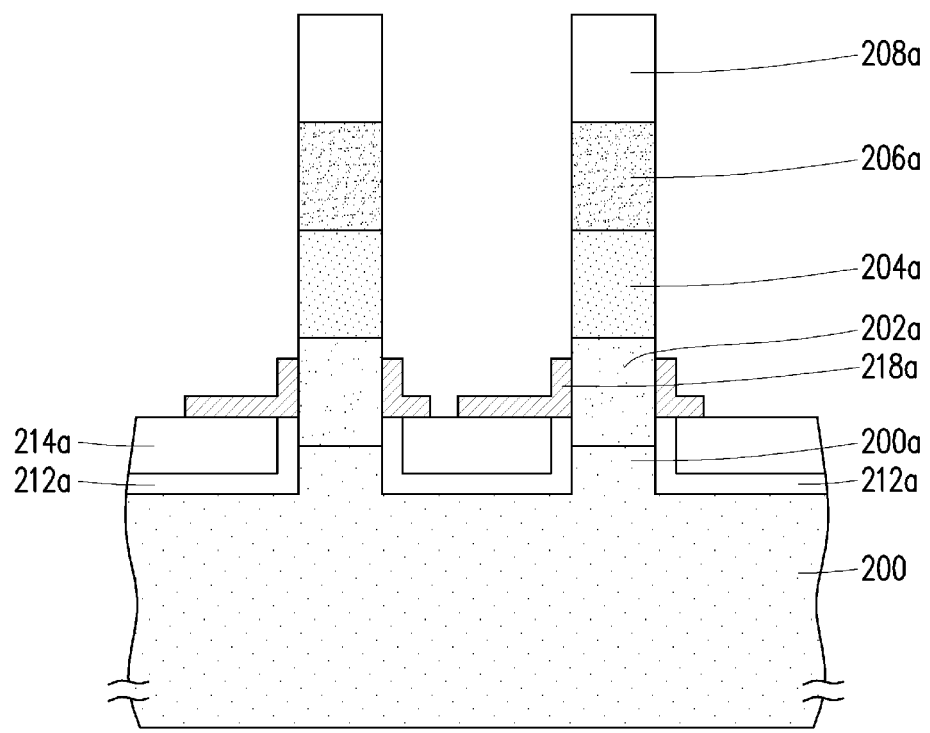
Figure 2J:
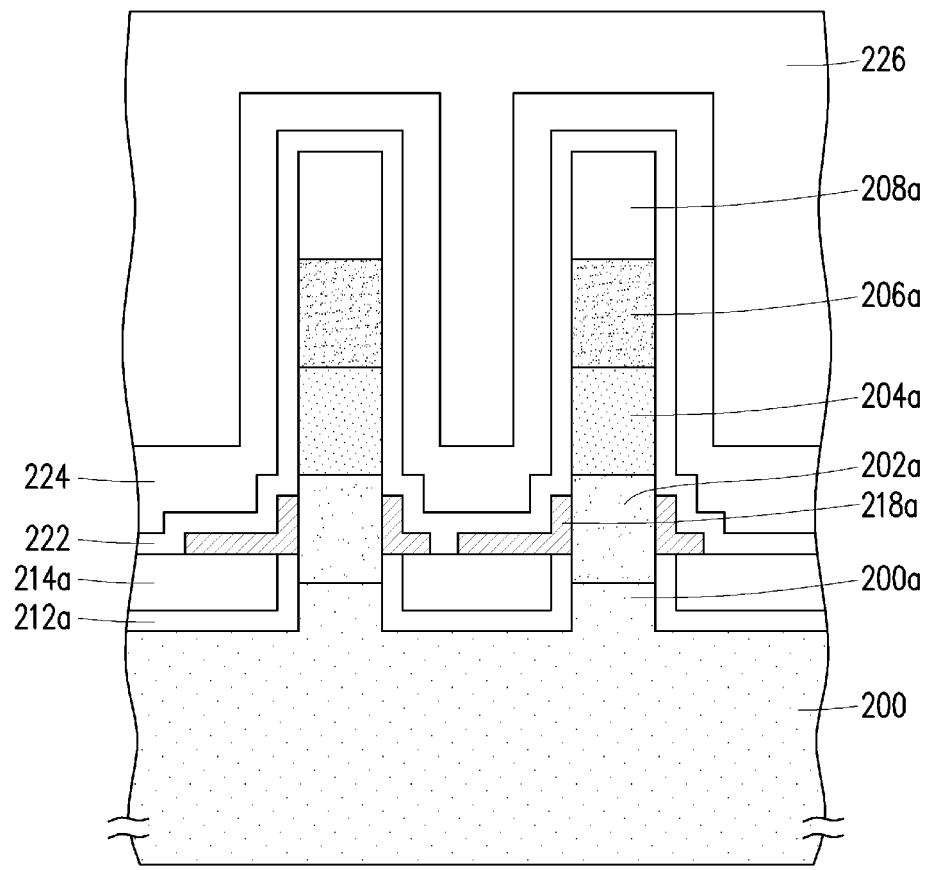
Figure 2K:
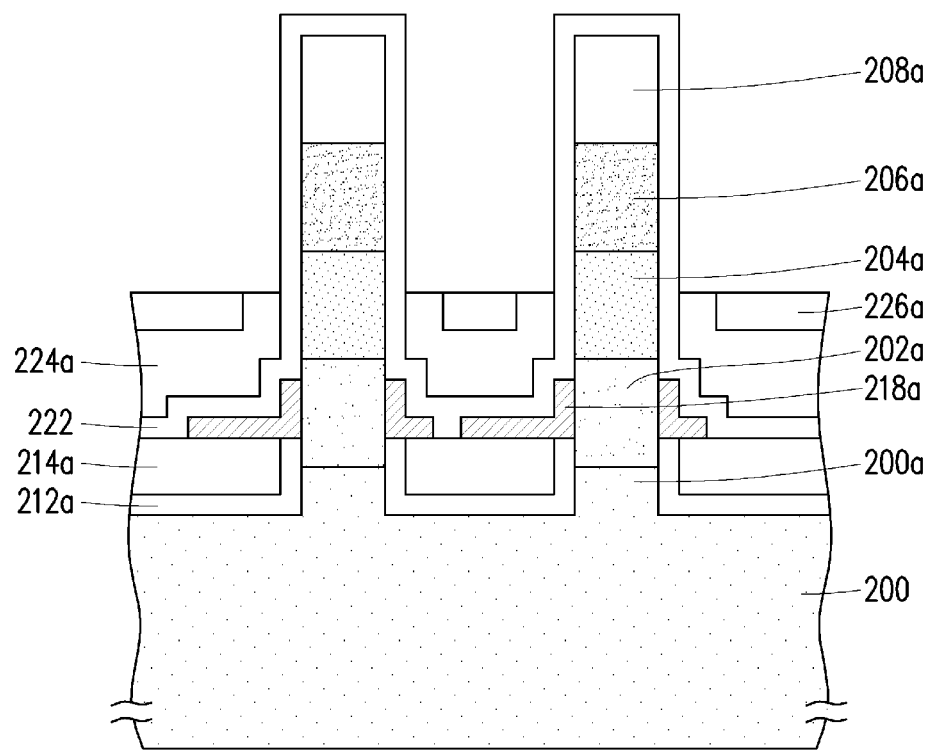
Figure 2L:
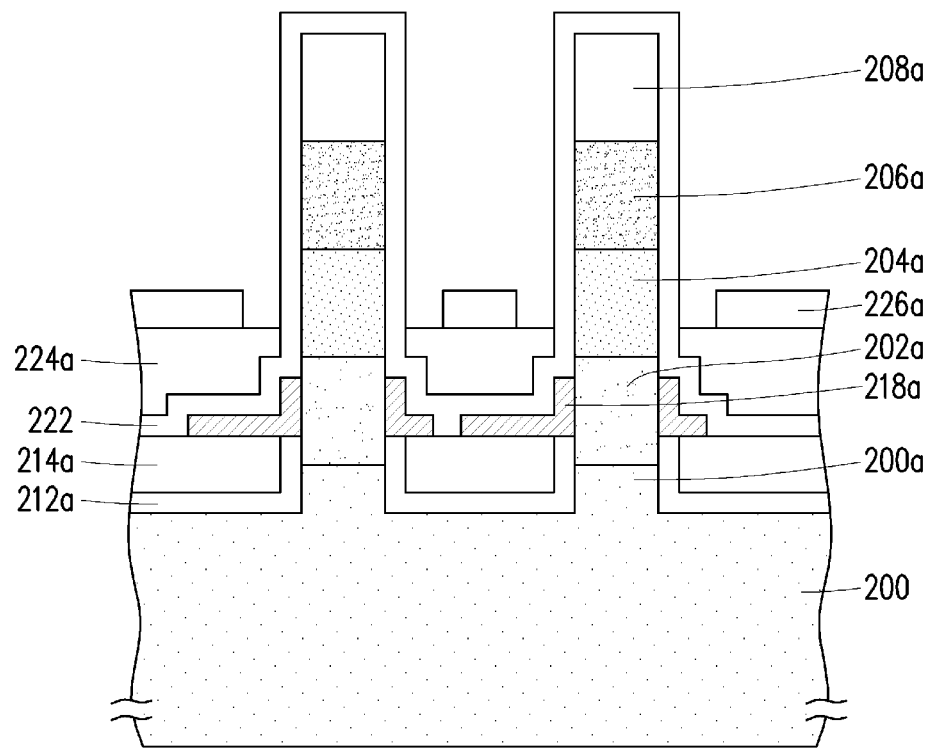
Figure 2M:
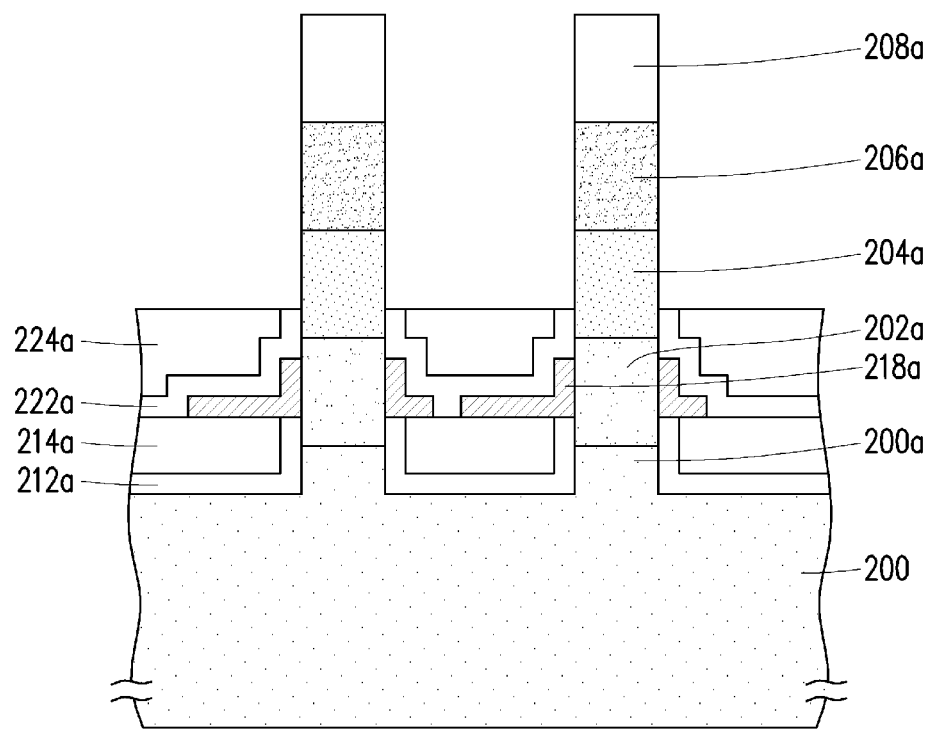
Figure 2N:
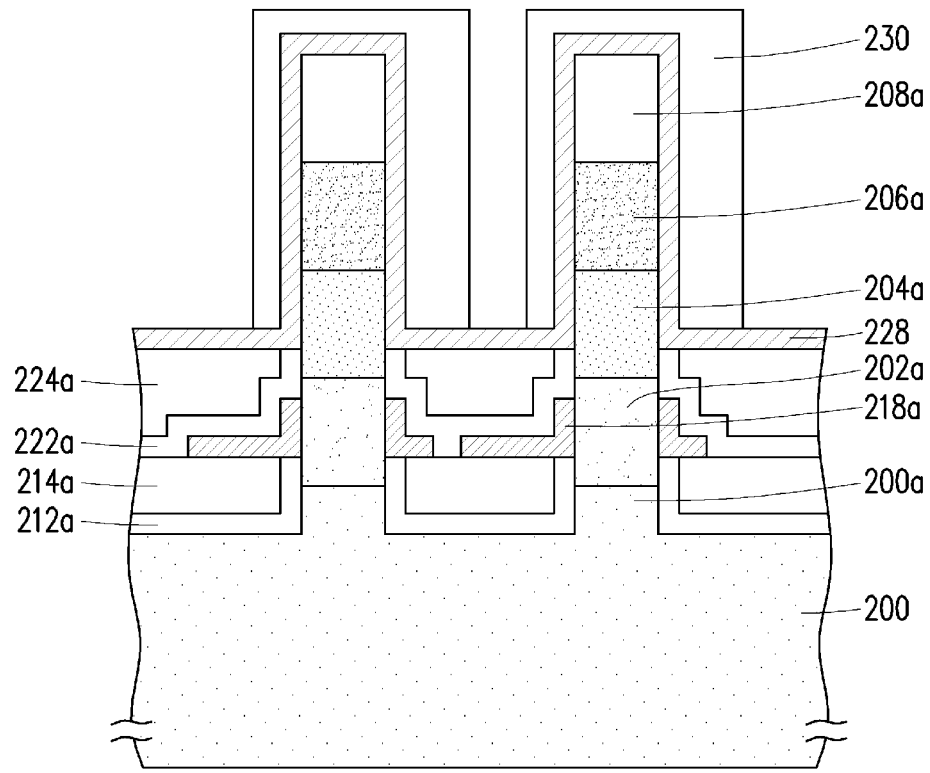
Figure 20:
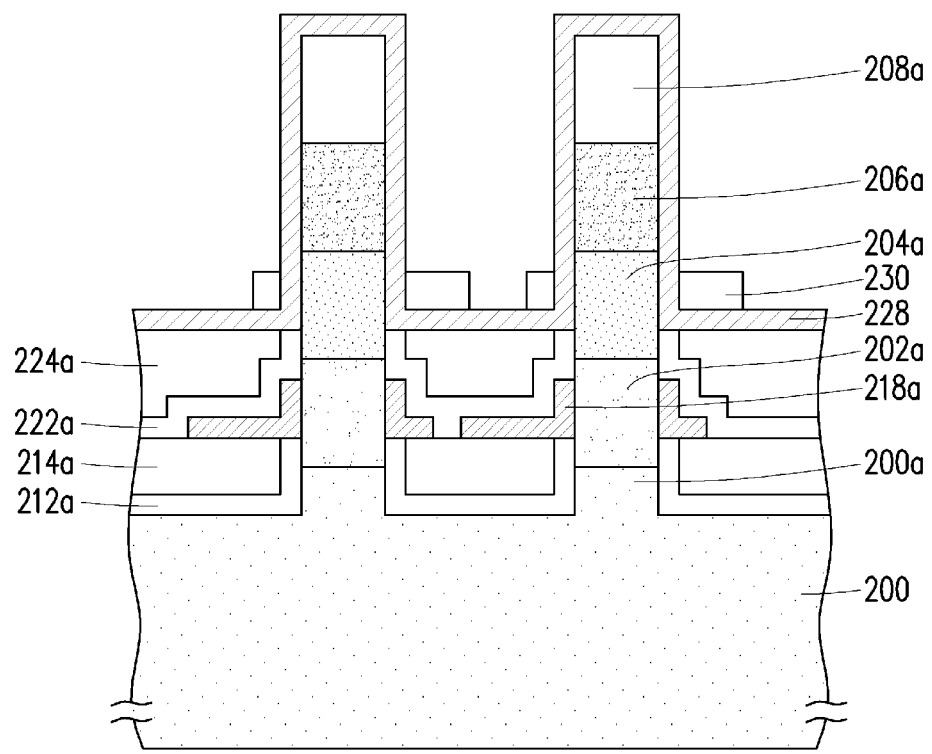
Figure 2P:
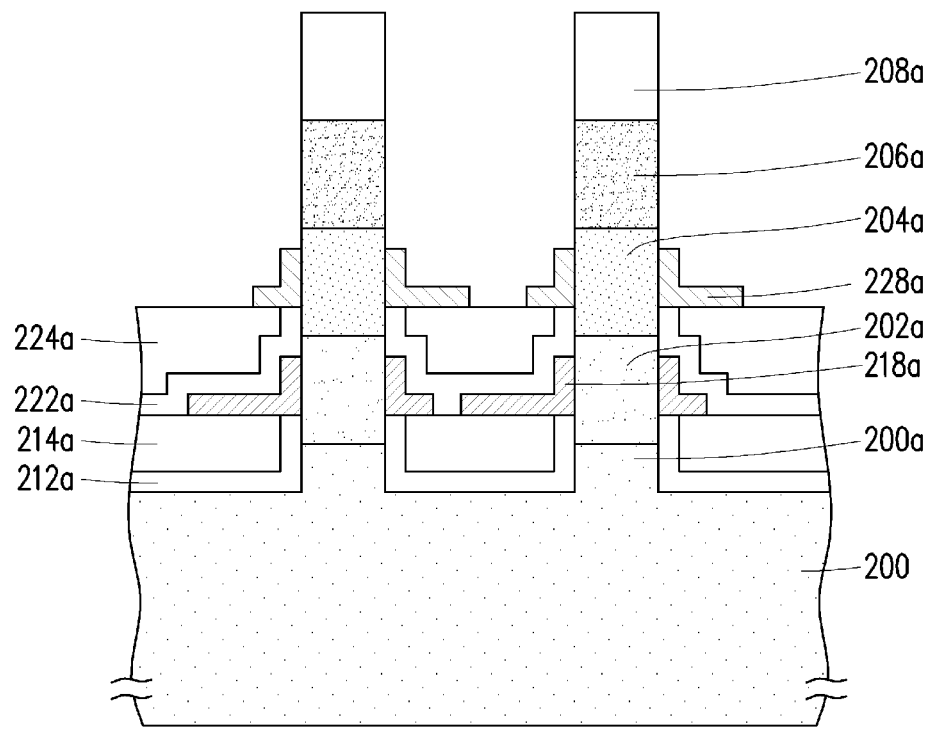
Figure 2Q:
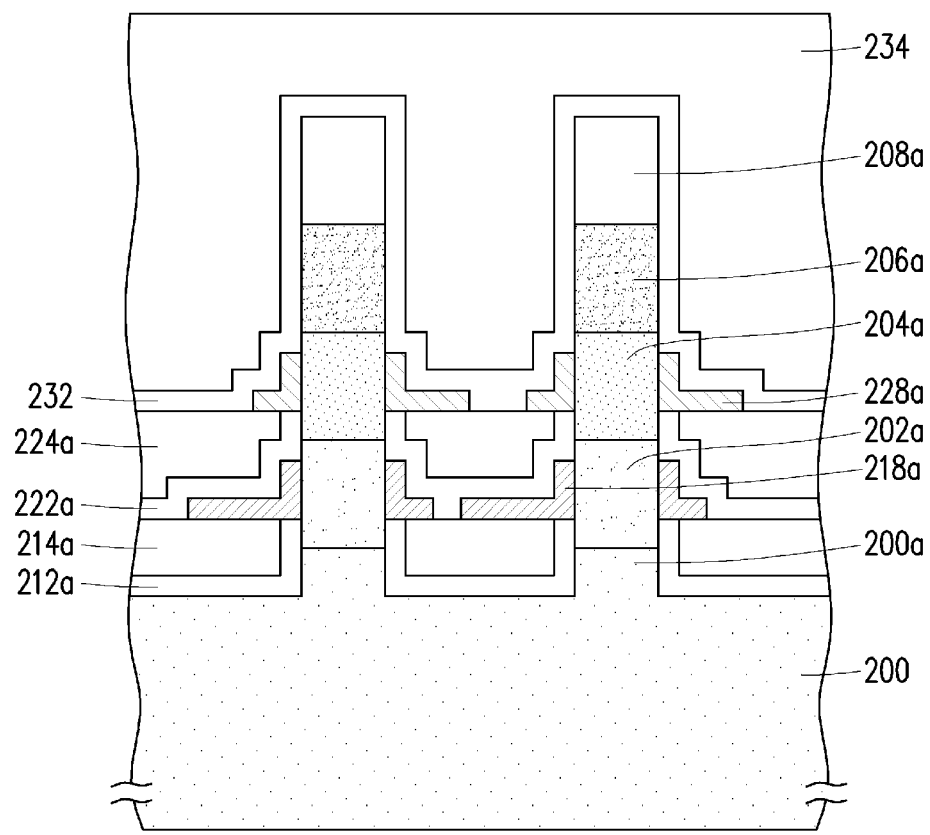
Figure 2R:
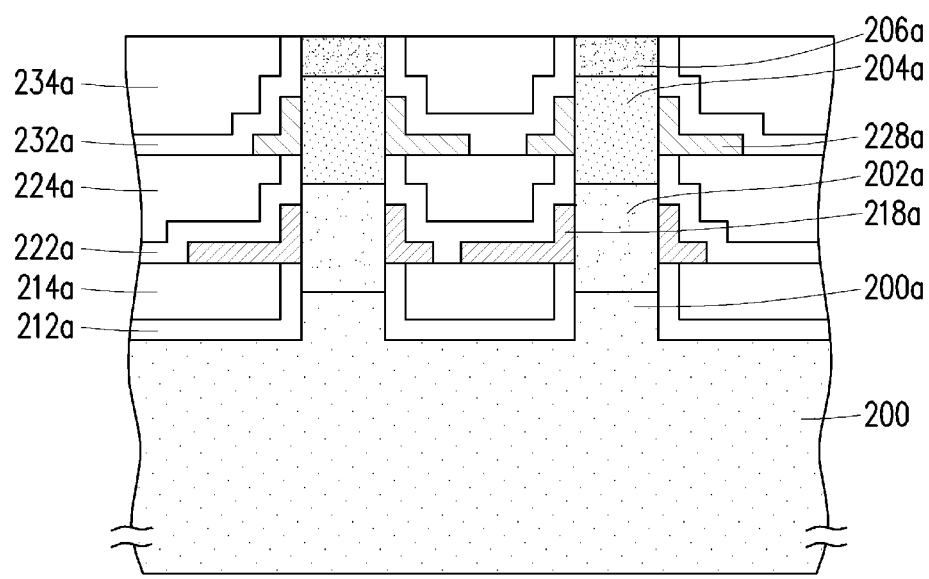
Figure 2S:
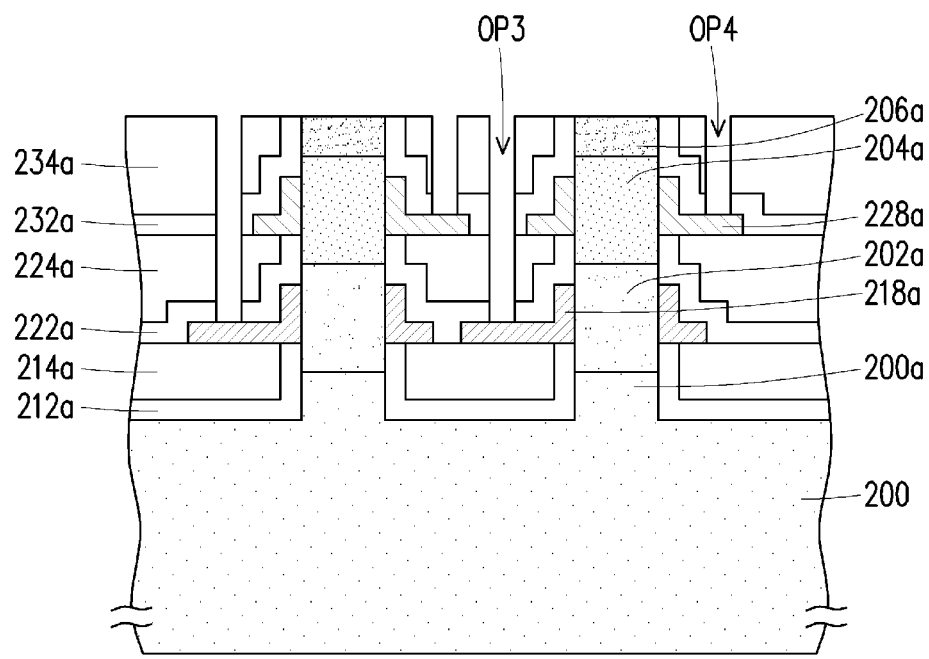
Figure 2T:
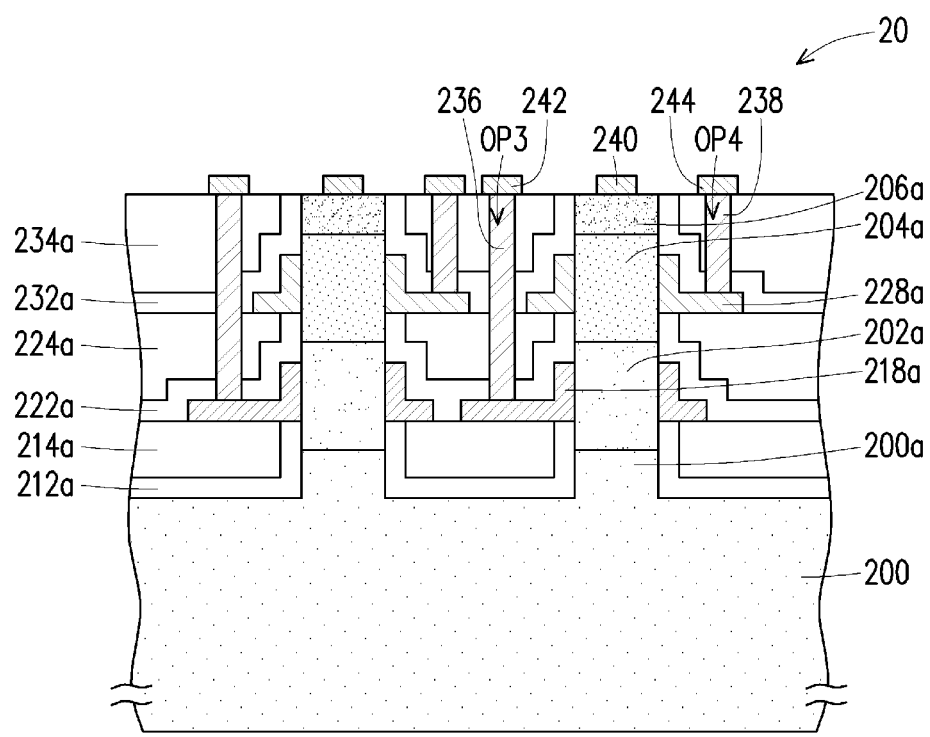

FIG. 2A to FIG. 2T are cross-sectional views illustrating a manufacturing process of an image sensor structure according to another embodiment of the invention.

Referring to FIG. 2A, a substrate 200 is provided. The substrate 200 is a doped material layer. In some embodiments, the substrate 200 may be a doped semiconductor substrate, such as a doped single crystal silicon substrate. The substrate 200 has the first conductive type (e.g., P-type). Hereinafter, the first conductive type and the second conductive type may be different conductive types. The first conductive type and the second conductive type may be one and the other of the P-type and the N-type, respectively. In the present embodiment, the first conductive type is, for example, P-type, and the second conductive type is, for example, N-type, but the invention is not limited thereto. In other embodiments, the first conductive type may be N-type, and the second conductive type may be P-type. In the present embodiment, the conductive type of the substrate 200 is, for example, P-type, and the dopant of the substrate 200 may include boron.

A doped material layer 202, a doped material layer 204, and a doped material layer 206 are sequentially formed on the substrate 200. The doped material layer 202 and the doped material layer 206 have the second conductive type (e.g., N-type). The doped material layer 204 has the first conductive type (e.g., P-type). The dopant concentration (e.g., N-type dopant concentration) of the doped material layer 202 may be greater than the dopant concentration (e.g., P-type dopant concentration) of the substrate 200. The dopant concentration (e.g., P-type dopant concentration) of the doped material layer 204 may be greater than the dopant concentration (e.g., N-type dopant concentration) of the doped material layer 202. The dopant concentration (e.g., N-type dopant concentration) of the doped material layer 206 may be greater than the dopant concentration (e.g., P-type dopant concentration) of the doped material layer 204. For example, the dopant concentration of the substrate 200 may be $1 \times 10^{15}$ ions/cm$^3$ to $5 \times 10^{15}$ ions/cm$^3$, the dopant concentration of the doped material layer 202 may be $1 \times 10^{16}$ ions/cm$^3$ to $5 \times 10^{16}$ ions/cm$^3$, the dopant concentration of the doped material layer 204 may be $1 \times 10^{17}$ ions/cm$^3$ to $5\times10^{17}$ ions/cm$^3$, and the dopant concentration of the doped material layer 206 may be $1\times10^{18}$ ions/cm$^3$ to $5\times10^{18}$ ions/cm$^3$.

In some embodiments, the method of forming the doped material layer 202, the doped material layer 204, and the doped material layer 206 may include the following steps. A first epitaxial growth process is performed to form the doped material layer 202 on the substrate 200. A second epitaxial growth process is performed to form the doped material layer 204 on the doped material layer 202. A third epitaxial growth process is performed to form the doped material layer 206 on the doped material layer 204. The first epitaxial growth process, the second epitaxial growth process, and the third epitaxial growth process may be epitaxial growth processes with in-situ doping.

In some embodiments, in the case that the N-type doped material layer 202 is formed by the first epitaxial growth process, the N-type dopant used in the first epitaxial growth process may include arsenic, antimony, bismuth, or tellurium. The thickness of the doped material layer 202 is, for example, 1 μm to 2 μm. In some embodiments, in the case that the P-type doped material layer 204 is formed by the second epitaxial growth process, the P-type dopant used in the second epitaxial growth process may include boron. In addition, the dopant used in the second epitaxial growth process may further include carbon, thereby effectively inhibiting the boron dopants in the doped material layer 204 from diffusing into the adjacent layers. The concentration of the boron dopant in the doped material layer 204 may be $1\times10^{17}$ ions/cm$^3$ to $5\times10^{17}$ ions/cm$^3$. The thickness of the doped material layer 204 is, for example, 0.3 μm to 0.6 μm. In some embodiments, in the case that the N-type doped material layer 206 is formed by the third epitaxial growth process, the N-type dopant used in the third epitaxial growth process may include arsenic, antimony, bismuth, or tellurium. The thickness of the doped material layer 206 is, for example, 0.15 μm to 0.35 μm.

In other embodiments, the method of forming the doped material layer 202, the doped material layer 204, and the doped material layer 206 may include the following steps. A first ion implantation process is performed on the substrate 200 to form the doped material layer 202. After the first ion implantation process is performed, a second ion implantation process is performed on the substrate 200 to form the doped material layer 204. After the second ion implantation process is performed, a third ion implantation process is performed on the substrate 200 to form the doped material layer 206.

In some embodiments, in the case that the N-type doped material layer 202 is formed by the first ion implantation process, the N-type dopant used in the first ion implantation process may include phosphorus or arsenic. In some embodiments, in the case that the P-type doped material layer 204 is formed by the second ion implantation process, the P-type dopant used in the second ion implantation process may include boron, boron difluoride, or indium (In). In addition, in the case that the P-type dopant used in the second ion implantation process is boron or boron difluoride (BF$_2$), the dopant used in the second ion implantation process may further include carbon, thereby effectively inhibiting the boron dopants in the doped material layer 204 from diffusing into the adjacent layers. The concentration of the boron dopant in the doped material layer 204 may be $1\times10^{17}$ ions/cm$^3$ to $5\times10^{17}$ ions/cm$^3$. In some embodiments, in the case that the N-type doped material layer 206 is formed by the third ion implantation process, the N-type dopant used in the third ion implantation process may include phosphorus, arsenic, antimony, or tellurium. In some embodiments, after the third ion implantation process is performed, a thermal process may be performed to the substrate 200, thereby repairing defects generated by the ion implantation process.

A hard mask material layer 208 may be formed on the doped material layer 206. The material of the hard mask material layer 208 is, for example, silicon oxide, silicon nitride, or a combination thereof. The method of forming the hard mask material layer 208 is, for example, a CVD method.

Referring to FIG. 2B, the substrate 200, the doped material layer 202, the doped material layer 204, and the doped material layer 206 are patterned to form a nanowire structure 210. The nanowire structure 210 includes a doped layer 200a, a doped layer 202a, a doped layer 204a, and a doped layer 206a sequentially stacked on the substrate 200. The doped layer 200a and the doped layer 204a have the first conductive type (e.g., P-type). The doped layer 202a and the doped layer 206a have the second conductive type (e.g., N-type). The doped layer 200a, the doped layer 202a, the doped layer 204a, and the doped layer 206a may be nanowires. Furthermore, the hard mask material layer 208 may be patterned to form a hard mask layer 208a on the doped layer 206a. For example, the hard mask material layer 208, the doped material layer 206, the doped material layer 204, the doped material layer 202, and the substrate 200 may be patterned by a lithography process and an etching process to form the doped layer 200a, the doped layer 202a, the doped layer 204a, the doped layer 206a, and the hard mask layer 208a sequentially stacked on the substrate 200.

Referring to FIG. 2C, a liner material layer 212 may be conformally formed on the substrate 200, the nanowire structure 210, and the hard mask layer 208a. The material of the liner material layer 212 is, for example, silicon oxide. The method of forming the liner material layer 212 is, for example, a thermal oxidation method, a CVD method, or an ALD method.

A dielectric material layer 214 may be formed on the liner material layer 212. The material of the dielectric material layer 214 is, for example, silicon nitride, silicon carbonitride, silicon oxynitride, or a combination thereof. The method of forming the dielectric material layer 214 is, for example, a CVD method or an ALD method.

A photoresist layer 216 may be formed on the dielectric material layer 214. The method of forming the photoresist layer 216 is, for example, a spin coating method.

Referring to FIG. 2D, a portion of the photoresist layer 216 and a portion of the dielectric material layer 214 may be removed, thereby forming a photoresist layer 216a and a dielectric layer 214a. In some embodiments, a portion of the photoresist layer 216 may be removed, and then a portion of the dielectric material layer 214 may be removed, but the invention is not limited thereto. The method of removing a portion of the photoresist layer 216 is, for example, an etching method. The method of removing a portion of the dielectric material layer 214 is, for example, an etching method.

Referring to FIG. 2E, a portion of the dielectric layer 214a may be removed, so that the top surface of the dielectric layer 214a may be lower than the top surface of the photoresist layer 216a. The method of removing a portion of the dielectric layer 214a is, for example, an etching method.

Referring to FIG. 2F, the photoresist layer 216a may be removed. The method of removing the photoresist layer 216a is, for example, a dry stripping method or a wet stripping method.

A portion of the liner material layer 212 may be removed to form a liner layer 212a. By the above method, the dielectric layer 214a and the liner layer 212a may be formed on the substrate 200, the doped layer 200a, and the doped layer 202a. The dielectric layer 214a may be located on the liner layer 212a. The liner layer 212a may be in direct contact with the substrate 200, the doped layer 200a, and the doped layer 202a. The dielectric layer 214a and the liner layer 212a may expose a portion of the sidewall of the doped layer 202a. The method of removing a portion of the liner material layer 212 is, for example, an etching method.

Referring to FIG. 2Q a conductive layer 218 may be conformally formed on the dielectric layer 214a, the doped layer 202a, the doped layer 204a, the doped layer 206a, and the hard mask layer 208a. The material of the conductive layer 218 is, for example, tungsten, aluminum, titanium nitride, tantalum nitride, titanium carbide, titanium aluminum, titanium aluminum nitride, titanium carbon nitride, or doped polysilicon. The method of forming the conductive layer 218 is, for example, a CVD method or an ALD method. In some embodiments, an etch stop layer (not shown) may be conformally formed on the conductive layer 218, and the description thereof is omitted here.

A patterned photoresist layer 220 may be formed on the conductive layer 218, the doped layer 202a, the doped layer 204a, the doped layer 206a, and the hard mask layer 208a. The patterned photoresist layer 220 may be formed by a lithography process.

Referring to FIG. 2H, the height of the patterned photoresist layer 220 may be reduced. After the height of the patterned photoresist layer 220 is reduced, the height of the top surface of the patterned photoresist layer 220 may be lower than the height of the top surface of the doped layer 202a, and the patterned photoresist layer 220 may expose a portion of the conductive layer 218. The method of reducing the height of the patterned photoresist layer 220 is, for example, an etching method.

Referring to FIG. 2I, the portion of the conductive layer 218 exposed by the patterned photoresist layer 220 may be removed to form a conductive line 218a. Thereby, a conductive line 218a connected to the sidewall of the doped layer 202a may be formed. The conductive line 218a may be electrically connected to the doped layer 202a. In some embodiments, the conductive line 218a may be in direct contact with the doped layer 202a. The method of removing the portion of the conductive layer 218 is, for example, an etching method.

Then, the patterned photoresist layer 220 may be removed. The method of removing the patterned photoresist layer 220 is, for example, a dry stripping method or a wet stripping method.

Referring to FIG. 2J, a liner material layer 222 may be conformally formed on the dielectric layer 214a, the conductive line 218a, the doped layer 202a, the doped layer 204a, the doped layer 206a, and the hard mask layer 208a. The material of the liner material layer 222 is, for example, silicon oxide. The method of forming the liner material layer 222 is, for example, a CVD method or an ALD method.

A dielectric material layer 224 may be formed on the liner material layer 222. The material of the dielectric material layer 224 is, for example, silicon nitride, silicon carbonitride, silicon oxynitride, or a combination thereof. The method of forming the dielectric material layer 224 is, for example, a CVD method or an ALD method.

A photoresist layer 226 may be formed on the dielectric material layer 224. The method of forming the photoresist layer 226 is, for example, a spin coating method.

Referring to FIG. 2K, a portion of the photoresist layer 226 and a portion of the dielectric material layer 224 may be removed, thereby forming a photoresist layer 226a and a dielectric layer 224a. In some embodiments, a portion of the photoresist layer 226 may be removed, and then a portion of the dielectric material layer 224 may be removed, but the invention is not limited thereto. The method of removing a portion of the photoresist layer 226 is, for example, an etching method. The method of removing a portion of the dielectric material layer 224 is, for example, an etching method.

Referring to FIG. 2L, a portion of the dielectric layer 224a may be removed, so that the top surface of the dielectric layer 224a may be lower than the top surface of the photoresist layer 226a. The method of removing a portion of the dielectric layer 224a is, for example, an etching method.

Referring to FIG. 2M, the photoresist layer 226a may be removed. The method of removing the photoresist layer 226a is, for example, a dry stripping method or a wet stripping method.

A portion of the liner material layer 222 may be removed to form a liner layer 222a. By the above method, the dielectric layer 224a and the liner layer 222a may be formed on the dielectric layer 214a and the conductive line 218a. The dielectric layer 224a may be located on the liner layer 222a. The liner layer 222a may be in direct contact with the dielectric layer 214a, the conductive line 218a, the doped layer 202a, and the doped layer 204a. The dielectric layer 224a and the liner layer 222a expose a portion of the sidewall of the doped layer 204a. The method of removing a portion of the liner material layer 222 is, for example, an etching method.

Referring to FIG. 2N, a conductive layer 228 may be conformally formed on the dielectric layer 224a, the doped layer 204a, the doped layer 206a, and the hard mask layer 208a. The material of the conductive layer 228 is, for example, tungsten, aluminum, titanium nitride, tantalum nitride, titanium carbide, titanium aluminum, titanium aluminum nitride, titanium carbon nitride, or doped polysilicon. The method of forming the conductive layer 228 is, for example, a CVD method or an ALD method. In some embodiments, an etch stop layer (not shown) may be conformally formed on the conductive layer 228, and the description thereof is omitted here.

A patterned photoresist layer 230 may be formed on the conductive layer 228, the doped layer 204a, the doped layer 206a, and the hard mask layer 208a. The patterned photoresist layer 230 may be formed by a lithography process.

Referring to FIG. 2O, the height of the patterned photoresist layer 230 may be reduced. After the height of the patterned photoresist layer 230 is reduced, the height of the top surface of the patterned photoresist layer 230 may be lower than the height of the top surface of the doped layer 204a, and the patterned photoresist layer 230 may expose a portion of the conductive layer 228. The method of reducing the height of the patterned photoresist layer 230 is, for example, an etching method.

Referring to FIG. 2P, the portion of the conductive layer 228 exposed by the patterned photoresist layer 230 may be removed to form a conductive line 228a. Thereby, a conductive line 228a connected to the sidewall of the doped layer 204a may be formed. The conductive line 228a may be electrically connected to the doped layer 204a. In some embodiments, the conductive line 228a may be in direct contact with the doped layer 204a. The method of removing the portion of the conductive layer 228 is, for example, an etching method.

The patterned photoresist layer 230 may be removed. The method of removing the patterned photoresist layer 230 is, for example, a dry stripping method or a wet stripping method.

Referring to FIG. 2Q, a liner material layer 232 may be conformally formed on the dielectric layer 224a, the conductive line 228a, the doped layer 204a, the doped layer 206a, and the hard mask layer 208a. The material of the liner material layer 232 is, for example, silicon oxide. The method of forming the liner material layer 232 is, for example, a CVD method or an ALD method.

A dielectric material layer 234 may be formed on the liner material layer 232. The material of the dielectric material layer 234 is, for example, silicon nitride, silicon carbonitride, silicon oxynitride, or a combination thereof. The method of forming the dielectric material layer 234 is, for example, a CVD method or an ALD method.

Referring to FIG. 2R, a portion of the dielectric material layer 234, a portion of the liner material layer 232, and the hard mask layer 208a may be removed, thereby exposing the top surface of the doped layer 206a and forming a dielectric layer 234a and liner layer 232a on the dielectric layer 224a and the conductive line 228a. The dielectric layer 234a may be located on the liner layer 232a. The liner layer 232a may be in direct contact with the dielectric layer 224a, the conductive line 228a, the doped layer 204a, and the doped layer 206a. In some embodiments, a portion of the doped layer 206a may be removed. The method of removing a portion of the dielectric material layer 234, a portion of the liner material layer 232, the hard mask layer 208a, and a portion of the doped layer 206a is, for example, a CMP method.

Referring to FIG. 2S, an opening OP3 exposing the conductive line 218a may be formed in the dielectric layer 234a, the liner layer 232a, the dielectric layer 224a, and the liner layer 222a, and an opening OP4 exposing the conductive line 228a may be formed in the dielectric layer 234a and the liner layer 232a. The method of forming the opening OP3 is, for example, removing a portion of the dielectric layer 234a, a portion of the liner layer 232a, a portion of the dielectric layer 224a, and a portion of the liner layer 222a by a lithography process and an etching process. In addition, the method of forming the opening OP4 is, for example, removing a portion of the dielectric layer 234a and a portion of the liner layer 232a by a lithography process and an etching process.

Referring to FIG. 2T, a conductive plug 236 and a conductive plug 238 may be respectively formed in the opening OP3 and the opening OP4. Thereby, the conductive plug 236 connected to the conductive line 218a may be formed, and the conductive plug 238 connected to the conductive line 228a may be formed. The material of the conductive plug 236 and the conductive plug 238 is, for example, tungsten. The conductive plug 236 and the conductive plug 238 may be electrically connected to the conductive line 218a and the conductive line 228a, respectively. In some embodiments, the conductive plug 236 may be in direct contact with the conductive line 218a, and the conductive plug 238 may be in direct contact with the conductive line 228a. The method of forming the conductive plug 236 and the conductive plug 238 is, for example, forming a conductive layer (not shown) filling the opening OP3 and the opening OP4, and then removing the conductive layer located outside the opening OP3 and the opening OP4 by a CMP method.

A conductive line 240 connected to the doped layer 206a is formed. In addition, a conductive line 242 connected to the conductive plug 236 may be formed. Furthermore, a conductive line 244 connected to the conductive plug 238 may be formed. The conductive line 240, the conductive line 242, and the conductive line 244 may be located on the same plane, thereby facilitating the integration with the back end of line (BEOL) process. The conductive line 240, the conductive line 242, and the conductive line 244 may be electrically connected to the doped layer 206a, the conductive plug 236, and the conductive plug 238, respectively. In some embodiments, the conductive line 240 may be in direct contact with the doped layer 206a, the conductive line 242 may be in direct contact with the conductive plug 236, and the conductive line 244 may be in direct contact with the conductive plug 238. The material of the conductive line 240, the conductive line 242, and the conductive line 244 is, for example, aluminum, tungsten, or titanium. The method of forming the conductive line 240, the conductive line 242, and the conductive line 244 is, for example, forming a conductive layer (not shown) by a deposition process, and then patterning the conductive layer by a lithography process and an etching process.

Hereinafter, the image sensor structure 20 of the above embodiment will be described with reference to FIG. 2T. In addition, although the method for forming the image sensor structure 20 is described by taking the above method as an example, the invention is not limited thereto.

Referring to FIG. 2T, the image sensor structure 20 includes a substrate 200, a nanowire structure 210, a conductive line 218a, a conductive line 228a, and a conductive line 240. The nanowire structure 210 includes a doped layer 200a, a doped layer 202a, a doped layer 204a, and a doped layer 206a sequentially stacked on the substrate 200. The doped layer 200a and the doped layer 204a have the first conductive type (e.g., P-type). The doped layer 202a and the doped layer 206a have the second conductive type (e.g., N-type). The doped layer 200a and the doped layer 202a may form an image sensing device 246. The doped layer 202a and the doped layer 204a may form an image sensing device 248. The doped layer 204a and the doped layer 206a may form an image sensing device 250. For example, the image sensing device 246 may be an image sensing device for sensing red light, the image sensing device 248 may be an image sensing device for sensing green light, and the image sensing device 250 may be an image sensing device for sensing blue light. The image sensing device 246, the image sensing device 248, and the image sensing device 250 may be photodiodes. The doped layer 200a may be a portion of the substrate 200. The top surface of the doped layer 200a may be higher than the top surface of another portion of the substrate 200.

The dopant concentration (e.g., N-type dopant concentration) of the doped layer 202a may be greater than the dopant concentration (e.g., P-type dopant concentration) of the doped layer 200a. The dopant concentration (e.g., P-type dopant concentration) of the doped layer 204a may be greater than the dopant concentration (e.g., N-type dopant concentration) of the doped layer 202a. The dopant concentration (e.g., N-type dopant concentration) of the doped layer 206a may be greater than the dopant concentration (e.g., P-type dopant concentration) of the doped layer 204a. For example, the dopant concentration of the doped layer 200a may be $1 \times 10^{15}$ ions/cm$^3$ to $5 \times 10^{15}$ ions/cm$^3$, the dopant concentration of the doped layer 202a may be $1 \times 10^{16}$ ions/cm$^3$ to $5 \times 10^{16}$ ions/cm$^3$, the dopant concentration of the doped layer 204a may be $1 \times 10^{17}$ ions/cm$^3$ to $5 \times 10^{17}$ ions/cm$^3$, and the dopant concentration of the doped layer 206a may be $1 \times 10^{18}$ ions/cm$^3$ to $5 \times 10^{18}$ ions/cm$^3$.

The conductive line 218a is connected to the sidewall of the doped layer 202a. In some embodiments, the cross-sectional shape of the conductive line 218a may be L-shaped. The conductive line 228a is connected to the sidewall of the doped layer 204a. In some embodiments, the cross-sectional shape of the conductive line 228a may be L-shaped. The conductive line 240 is connected to the doped layer 206a. The conductive line 240 may be connected to the top surface of the doped layer 206a.

The image sensor structure 20 may further include at least one of a dielectric layer 214a, a dielectric layer 224a, a dielectric layer 234a, a liner layer 212a, a liner layer 222a, and a liner layer 232a. The dielectric layer 214a is disposed on the substrate 200. The conductive line 218a is disposed on the dielectric layer 214a. The liner layer 212a is disposed between the dielectric layer 214a and the substrate 200. The dielectric layer 224a is disposed on the dielectric layer 214a and the conductive line 218a. The conductive line 228a is disposed on the dielectric layer 224a. The liner layer 222a is disposed between the dielectric layer 224a and the dielectric layer 214a. The dielectric layer 234a is disposed on the dielectric layer 224a and the conductive line 228a. The liner layer 232a is disposed between the dielectric layer 234a and the dielectric layer 224a.

The image sensor structure 20 may further include at least one of a conductive plug 236, a conductive plug 238, a conductive line 242, and a conductive line 244. The conductive plug 236 is connected to the conductive line 218a. The conductive plug 238 is connected to the conductive line 228a. The conductive line 242 is connected to the conductive plug 236. The conductive line 244 is connected to the conductive plug 238.

In addition, the material, the arrangement, the forming method, and the effect of each component in the image sensor structure 20 have been described in detail in the above embodiments and are not repeated herein.

Based on the above embodiment, in the image sensor structure 20 and the manufacturing method thereof, the nanowire structure 210 includes the doped layer 200a, the doped layer 202a, the doped layer 204a, and the doped layer 206a sequentially stacked on the substrate 200. The doped layer 200a and the doped layer 204a have the first conductive type, and the doped layer 202a and the doped layer 206a have the second conductive type. In this way, the pixel of the image sensor structure 20 can have the image sensing device 246, the image sensing device 248, and the image sensing device 250 that are vertically stacked and respectively used to sense red light, green light, and blue light, thereby effectively reducing the pixel area. In addition, since the image sensing device 246, the image sensing device 248, and the image sensing device 250 may have approximately the same top view area, the image sensor structure 20 can have a balanced energy proportion of RGB. Furthermore, the manufacturing process of the image sensor structure 20 can be integrated with the manufacturing process of the complementary metal oxide semiconductor (CMOS). Moreover, two adjacent pixels in the image sensor structure 20 can be well isolated. On the other hand, the image sensor structure 20 does not need color filters, thereby reducing the manufacturing cost and the process complexity.

In summary, in the image sensor structure and the manufacturing method thereof of the aforementioned embodiment, the nanowire structure includes a first doped layer, a second doped layer, a third doped layer, and a fourth doped layer sequentially stacked on a substrate. The first doped layer and the third doped layer have the first conductive type, and the second doped layer and the fourth doped layer have the second conductive type. Thereby, the pixel of the image sensor structure can have image sensing devices that are vertically stacked and respectively used to sense red light, green light, and blue light. Therefore, the pixel area can be effectively reduced, and the energy proportion of RGB can be balanced.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. An image sensor structure, comprising:
a substrate;
a nanowire structure comprising a first doped layer, a second doped layer, a third doped layer, and a fourth doped layer sequentially stacked on the substrate, wherein the first doped layer and the third doped layer have a first conductive type, and the second doped layer and the fourth doped layer have a second conductive type;
a first conductive line connected to a sidewall of the second doped layer;
a second conductive line connected to a sidewall of the third doped layer; and
a third conductive line connected to the fourth doped layer, wherein
the first conductive type and the second conductive type are different conductive types,
a maximum width of the first doped layer, a maximum width of the second doped layer, a maximum width of the third doped layer, and a maximum width of the fourth doped layer are the same, and
a cross-sectional shape of the first conductive line is L-shaped,
a cross-sectional shape of the second conductive line is L-shaped,
an entire topmost surface of the first conductive line is lower than an entire topmost surface of the second doped layer, and
an entire topmost surface of the second conductive line is lower than an entire topmost surface of the third doped layer.

2. The image sensor structure according to claim 1, wherein the first doped layer is a portion of the substrate, and a top surface of the first doped layer is higher than a top surface of another portion of the substrate.

3. The image sensor structure according to claim 1, wherein the first doped layer and the second doped layer form a first image sensing device, the second doped layer and the third doped layer form a second image sensing device, and the third doped layer and the fourth doped layer form a third image sensing device.

4. The image sensor structure according to claim 3, wherein the first image sensing device, the second image sensing device, and the third image sensing device comprise photodiodes.

5. The image sensor structure according to claim 1, wherein
a dopant concentration of the second doped layer is greater than a dopant concentration of the first doped layer,
a dopant concentration of the third doped layer is greater than the dopant concentration of the second doped layer, and a dopant concentration of the fourth doped layer is greater than the dopant concentration of the third doped layer.

6. The image sensor structure according to claim 5, wherein
the dopant concentration of the first doped layer is $1\times10^{15}$ ions/cm$^3$ to $5\times10^{15}$ ions/cm$^3$,
the dopant concentration of the second doped layer is $1\times10^{16}$ ions/cm$^3$ to $5\times10^{16}$ ions/cm$^3$,
the dopant concentration of the third doped layer is $1\times10^{17}$ ions/cm$^3$ to $5\times10^{17}$ ions/cm$^3$, and
the dopant concentration of the fourth doped layer is $1\times10^{18}$ ions/cm$^3$ to $5\times10^{18}$ ions/cm$^3$.

7. The image sensor structure according to claim 1, wherein the third conductive line is connected to a top surface of the fourth doped layer.

8. The image sensor structure according to claim 1, further comprising:
a first dielectric layer disposed on the substrate, wherein the first conductive line is disposed on the first dielectric layer;
a second dielectric layer disposed on the first dielectric layer and the first conductive line, wherein the second conductive line is disposed on the second dielectric layer; and
a third dielectric layer disposed on the second dielectric layer and the second conductive line.

9. The image sensor structure according to claim 1, further comprising:
a first conductive plug connected to the first conductive line; and
a second conductive plug connected to the second conductive line.

10. The image sensor structure according to claim 9, further comprising:
a fourth conductive line connected to the first conductive plug; and
a fifth conductive line is connected to the second conductive plug.

* * * * *